(12) United States Patent
Toizumi et al.

(10) Patent No.: US 11,002,773 B2
(45) Date of Patent: May 11, 2021

(54) MONITORING APPARATUS, MONITORING METHOD, AND STORAGE MEDIUM

(71) Applicant: NEC Corporation, Tokyo (JP)

(72) Inventors: Takahiro Toizumi, Tokyo (JP); Eisuke Saneyoshi, Tokyo (JP); Koji Kudo, Tokyo (JP); Hitoshi Yano, Tokyo (JP); Ryo Hashimoto, Tokyo (JP); Yuma Iwasaki, Tokyo (JP); Hisato Sakuma, Tokyo (JP)

(73) Assignee: NEC CORPORATION, Tokyo (JP)

( * ) Notice: Subject to any disclaimer, the term of this patent is extended or adjusted under 35 U.S.C. 154(b) by 541 days.

(21) Appl. No.: 14/905,585

(22) PCT Filed: Jul. 7, 2014

(86) PCT No.: PCT/JP2014/068068
§ 371 (c)(1),
(2) Date: Jan. 15, 2016

(87) PCT Pub. No.: WO2015/008645
PCT Pub. Date: Jan. 22, 2015

(65) Prior Publication Data
US 2016/0154038 A1  Jun. 2, 2016

(30) Foreign Application Priority Data

Jul. 17, 2013 (JP) .............................. JP2013-148325

(51) Int. Cl.
*G01R 21/00* (2006.01)
*G06Q 50/06* (2012.01)

(52) U.S. Cl.
CPC ............. *G01R 21/00* (2013.01); *G06Q 50/06* (2013.01); *Y04S 20/242* (2013.01); *Y04S 50/10* (2013.01)

(58) Field of Classification Search
CPC ......... G01R 21/00; G06Q 50/06; Y04S 50/10; Y04S 20/242
(Continued)

(56) References Cited

U.S. PATENT DOCUMENTS 9,356,444 B2 * 5/2016 Kubota ...................... H02J 3/32
2005/0171645 A1 * 8/2005 Oswald ................... G05B 15/02
700/276

(Continued)

FOREIGN PATENT DOCUMENTS

JP        4-273590        9/1992
JP        3403368         5/2003
(Continued)

OTHER PUBLICATIONS

"Real-Time Power Monitoring, Home Automation and Sustainability" by Wisam Nader, A Thesis, Presented to the Faculty of The Graduate College at the University of Nebraska (Year: 2011).*

(Continued)

*Primary Examiner* — Patricia D Reddington

(57) ABSTRACT

Provided is a monitoring apparatus including an acquisition unit that acquires first time-series data which is time-series data of a measured value and/or a feature amount regarding an electrical device group, and a registration and updating unit that, when a difference in values between a pre-state-change data value which is any one of a data value at a first point in time in the first time-series data and a statistic of a plurality of data values from a point in time earlier than the first point in time by a predetermined period of time to the first point in time and a post-state-change data value which is any one of a data value at a second point in time later than the first point in time and a statistic of a plurality of data values from the second point in time to a point in time later than the second point in time by a predetermined period of time satisfies a predetermined condition, stores a feature (Continued)

amount extracted from any waveform data of a total current consumption, a total power consumption, and a total input voltage of the electrical device group corresponding to the pre-state-change data value and the post-state-change data value which satisfy the predetermined condition, in a feature amount storage unit.

13 Claims, 22 Drawing Sheets

(58) Field of Classification Search
USPC .......................................................... 702/61
See application file for complete search history.

(56) References Cited

U.S. PATENT DOCUMENTS

| | | | |
|---|---|---|---|
| 2010/0070227 A1* | 3/2010 | Hyde | G01R 31/2825 702/77 |
| 2011/0251807 A1 | 10/2011 | Rada et al. | |
| 2012/0004871 A1 | 1/2012 | Tsao et al. | |
| 2013/0067253 A1* | 3/2013 | Tsuda | B60L 8/003 713/300 |

FOREIGN PATENT DOCUMENTS

| | | |
|---|---|---|
| JP | 2004-222375 | 8/2004 |
| JP | 2007-225374 | 9/2007 |
| JP | 4433890 | 3/2010 |
| JP | 4565511 | 10/2010 |
| JP | 2012-16270 | 1/2012 |
| JP | 2012-189526 | 10/2012 |
| JP | 2013-79853 | 5/2013 |
| JP | 2013-518556 | 5/2013 |

OTHER PUBLICATIONS

International Search Report and Written Opinion dated Aug. 26, 2014 in corresponding PCT International Application.

* cited by examiner

FIG. 4

| SERIAL NUMBER | FEATURE AMOUNT |
|---|---|
| 0001 | AAA |
| 0002 | BBB |
| ⋮ | ⋮ |

FIG. 7

| SERIAL NUMBER | FEATURE AMOUNT | DEVICE INFORMATION |
|---|---|---|
| 0001 | AAA | TELEVISION |
| 0002 | BBB | AIR CONDITIONER |
| ⋮ | ⋮ | ⋮ |

FIG. 8

| SERIAL NUMBER | FEATURE AMOUNT | DATA ACQUISITION DATE AND TIME | DEVICE INFORMATION |
|---|---|---|---|
| 0001 | AAA | APRIL 5, 2013 8:54 P.M. | TELEVISION |
| 0002 | BBB | APRIL 5, 2013 9:05 P.M. | — |
| ⋮ | ⋮ | ⋮ | ⋮ |

FIG. 9

SELECT ELECTRICAL DEVICE OF WHICH
POWER SUPPLY WAS SWITCHED ON/OFF
AT 8:54 P.M. ON APRIL 5, 2013

⬤ TELEVISION  ◯ REFRIGERATOR  ◯ AIR CONDITIONER

◯ PC          ....             ....

....          ....             ....

[ENTER]    110

AT PRESENT,

TELEVISION AND REFRIGERATOR
ARE OPERATING

| STATE ID | FEATURE AMOUNT | DEVICE INFORMATION |
|---|---|---|
| 00001 | CCC | TELEVISION, AIR CONDITIONER |
| 00002 | DDD | TELEVISION, AIR CONDITIONER, PC |
| 00003 | EEE | TELEVISION 1, TELEVISION 2, AIR CONDITIONER, PC |
| ⋮ | ⋮ | ⋮ |

FIG. 15

| STATE ID | FEATURE AMOUNT | DATA ACQUISITION DATE AND TIME | DEVICE INFORMATION |
|---|---|---|---|
| 00001 | CCC | APRIL 5, 2013 8:54 P.M. TO 9:05 P.M. | TELEVISION, AIR CONDITIONER |
| 00002 | DDD | APRIL 5, 2013 9:05 P.M. TO 11:12 P.M. | — |
| ⋮ | ⋮ | ⋮ | ⋮ |

FIG. 16

```
SELECT ELECTRICAL DEVICE THAT WAS
OPERATING AT 9 P.M. ON APRIL 5, 2013

⦿ TELEVISION 1      ⦿ TELEVISION 2      ○  ....
○ REFRIGERATOR 1    ⦿ REFRIGERATOR 2    ○  ....
○ AIR CONDITIONER 1 ○ AIR CONDITIONER 2 ○  ....

[ ENTER ]        ~110
```

MONITORING APPARATUS, MONITORING METHOD, AND STORAGE MEDIUM

CROSS-REFERENCE TO RELATED PATENT APPLICATIONS

This application is a National Stage Entry of International Application No. PCT/JP2014/068068, filed Jul. 7, 2014, which claims priority from Japanese Patent Application No. 2013-148325, filed Jul. 17, 2013. The entire contents of the above-referenced applications are expressly incorporated herein by reference.

TECHNICAL FIELD

The present invention relates to a monitoring apparatus, a monitoring method, and a program.

BACKGROUND ART

In recent years, systems, called home energy management systems (HEMS), which perform energy management of housing have been provided for electricity users of general households. The HEMS is a system that utilizes a sensor or an information technique. According to the HEMS, information indicating electricity use conditions in each household can be provided to each household. As a result, power saving and a reduction in electricity charges are promoted, and thus an energy saving effect is expected to be obtained. Such efforts have expanded and started to be applied to areas such as office floors, buildings, and stores.

Incidentally, in the related art, a technique for detecting operating states of individual electrical devices in households and the like and also providing the information thereof has been proposed. According to the technique, it is possible to instantaneously ascertain an operating state (type of electrical device being in operation, or the like) of an electrical device in each household. The related art is disclosed in Patent Documents 1 to 7.

Patent Document 1 discloses a technique for ascertaining the power consumption of individual electrical devices by including dedicated power consumption measurement devices in the individual electrical devices.

Patent Documents 2 and 3 disclose a technique for estimating operating states of individual electrical devices without directly measuring the power consumption of the electrical devices. Specifically, a technique is disclosed in which a measurement sensor measuring a power supply current, a power supply voltage, and a feature amount such as a calculated value, for example, a statistic obtained from the power supply current and the power supply voltage is installed in a power trunk line portion such as a switchboard, and it is estimated which electrical device is operating, using feature amounts (reference information) of individual electrical devices, which are stored in advance, during the operation thereof and measurement results of the measurement sensor.

Patent Document 4 discloses a technique for generating feature amounts (reference information) which are necessary for the estimation of operating states of individual electrical devices mentioned above. Specifically, a technique is disclosed in which predetermined pieces of data (current consumption and the like) are individually measured by operating the electrical devices one by one, and feature amounts are extracted from the pieces of measured data of the electrical devices and are saved.

Patent Document 5 discloses a technique for detecting an operating state of an electrical device with a high level of accuracy without needing to learn a combination of operating states of electrical devices.

Patent Document 6 discloses a technique for specifying an electrical device being used and managing the usage state of the electrical device without causing a change on the electrical device side and without adding a function.

Patent Document 7 discloses a technique for mechanically extracting a feature amount for classification which statistically coincides with an operator's intention of performing classification according to a general procedure only by allowing the operator to designate a general intention for classification.

RELATED DOCUMENTS

Patent Documents

[Patent Document 1] Japanese Unexamined Patent Application Publication No. 2007-225374
[Patent Document 2] Japanese Patent No. 3403368
[Patent Document 3] Japanese Patent No. 4565511
[Patent Document 4] Japanese Patent No. 4433890
[Patent Document 5] Japanese Unexamined Patent Application Publication No. 2012-189526
[Patent Document 6] Japanese Unexamined Patent Application Publication No. 2004-222375
[Patent Document 7] Japanese Unexamined Patent Application Publication No. H4(1992)-273590

SUMMARY OF THE INVENTION

Technical Problem

In the technique disclosed in Patent Document 1, the power consumption measurement device is installed in each of the electrical devices, and thus the same number of power measurement sensors have to be provided as the number of electrical devices. For this reason, the cost of the whole system increases, which results in a problem in that users have difficulty in introducing the system.

As in the techniques of Patent Documents 2 to 4, according to a technique (hereinafter, a first technique) in which feature amounts (reference data) of the respective plurality of electrical devices or feature amounts (reference data) which are obtained by combining the feature amounts may be compared with, for example, a feature amount of data measured in a distribution board, and thus an operating state of an electrical device is estimated, it is possible to solve the problem of the technique disclosed in Patent Document 1 mentioned above. However, the inventors have found the following new problems in the first technique.

In a case of the first technique, it is necessary to prepare in advance feature amounts (reference data) of the respective electrical devices or feature amounts (reference data) during the operation of the plurality of electrical devices. Naturally, types of electrical devices used in households, stores, or the like, model numbers of various types of electrical devices, and the like are different from each other, and thus reference data prepared in advance is different for each household, store, or the like. For this reason, it is not possible to store reference data in advance in a system at the stage of shipment. The reference data is required to be customized for each household, store, or the like. Hitherto, there has not been a technique for efficiently creating such reference data and storing the data in a system.

Patent Document 4 discloses a unit that individually performs a measurement process on a plurality of electrical devices, extracts feature amounts from measured data, and stores the extracted feature amounts in a system. However, a user of each household or each store may feel burdened with the execution of such a measurement process. As means for solving such a disadvantage, means is considered in which a provider providing a system of the first technique goes to each household or each store, performs a measurement process, and causes the feature amounts to be stored in a system. However, the type of electrical devices used in each household, each store, or the like and the number of electrical devices fluctuate due to the buying of replacements, or the like. Each time this happens, it is inefficient for a system provider to go to each household, each store, or the like and perform a measurement process. Means for solving such a problem is disclosed in none of Patent Documents 1 to 7.

An object of the present invention is to provide a new technique for creating reference data (teacher data) to be used in a technique in which feature amounts (reference data) of a plurality of electrical devices and/or feature amounts (reference data) obtained by combining the feature amounts are compared with a feature amount extracted from measured waveform data, to thereby estimate operating states of the electrical devices.

Solution to Problem

According to the present invention, there is provided a monitoring apparatus including an acquisition unit that acquires first time-series data which is time-series data of a measured value and/or a feature amount regarding an electrical device group, and a registration and updating unit that, when a difference in values between a pre-state-change data value which is any one of a data value at a first point in time in the first time-series data and a statistic of a plurality of data values from a point in time earlier than the first point in time by a predetermined period of time to the first point in time and a post-state-change data value which is any one of a data value at a second point in time later than the first point in time and a statistic of a plurality of data values from the second point in time to a point in time later than the second point in time by a predetermined period of time satisfies a predetermined condition, stores a feature amount extracted from any waveform data of a current consumption, a power consumption, and an input voltage of the electrical device group corresponding to the pre-state-change data value and the post-state-change data value which satisfy the predetermined condition, in a feature amount storage unit.

In addition, according to the present invention, there is provided a monitoring method including causing a computer to execute an acquisition process of acquiring first time-series data which is time-series data of a measured value and/or a feature amount regarding an electrical device group, and a registration and updating process of, when a difference in values between a pre-state-change data value which is any one of a data value at a first point in time in the first time-series data and a statistic of a plurality of data values from a point in time earlier than the first point in time by a predetermined period of time to the first point in time and a post-state-change data value which is any one of a data value at a second point in time later than the first point in time and a statistic of a plurality of data values from the second point in time to a point in time later than the second point in time by a predetermined period of time satisfies a predetermined condition, storing a feature amount extracted from any waveform data of a current consumption, a power consumption, and an input voltage of the electrical device group corresponding to the pre-state-change data value and the post-state-change data value which satisfy the predetermined condition, in a feature amount storage unit.

In addition, according to the present invention, there is provided a program causing a computer to function as an acquisition unit that acquires first time-series data which is time-series data of a measured value and/or a feature amount regarding an electrical device group, and a registration and updating unit that, when a difference in values between a pre-state-change data value which is any one of a data value at a first point in time in the first time-series data and a statistic of a plurality of data values from a point in time earlier than the first point in time by a predetermined period of time to the first point in time and a post-state-change data value which is any one of a data value at a second point in time later than the first point in time and a statistic of a plurality of data values from the second point in time to a point in time later than the second point in time by a predetermined period of time satisfies a predetermined condition, stores a feature amount extracted from any waveform data of a total current consumption, a total power consumption, and a total input voltage of the electrical device group corresponding to the pre-state-change data value and the post-state-change data value which satisfy the predetermined condition, in a feature amount storage unit.

Advantageous Effects of Invention

According to the present invention, it is possible to realize a new technique for creating reference data (teacher data) used in a technique in which a feature amount (reference data) of each of a plurality of electrical devices and/or a feature amount (reference data) obtained by combining the feature amounts is compared with a feature amount extracted from measured waveform data, to thereby estimate operating states of the electrical devices.

BRIEF DESCRIPTION OF THE DRAWINGS

The above-described objects, other objects, features and advantages will become more apparent from the preferred exemplary embodiments described below, and the accompanying drawings as follows.

FIG. 4 is a schematic diagram illustrating an example of information stored in a feature-amount-per-device storage unit.

FIG. 7 is a schematic diagram illustrating an example of information stored in a feature-amount-per-device storage unit.

FIG. 8 is a schematic diagram illustrating an example of information stored in a feature-amount-per-device storage unit.

FIG. 9 is a diagram illustrating an example of an input screen on which an input reception unit receives a user input.

FIG. 14 is a schematic diagram illustrating an example of information stored in a state feature amount storage unit.

FIG. 15 is a schematic diagram illustrating an example of information stored in a state feature amount storage unit.

FIG. 16 is a diagram illustrating an example of an input screen on which an input reception unit receives a user input.

DESCRIPTION OF EXEMPLARY EMBODIMENTS

Hereinafter, exemplary embodiments of the present invention will be described with reference to the accompanying drawings.

Meanwhile, an apparatus according to the present exemplary embodiment and each unit included in the apparatus are realized by an arbitrary combination of hardware and software on the basis of a central processing unit (CPU), a memory, a program loaded into the memory (including programs which are stored in the memory in advance when shipping out the device and programs which are downloaded from a storage medium such as a compact disc (CD), or a server or the like on the Internet), a storage unit such as a hard disk which stores the program, and an interface for network connection of an arbitrary computer. In addition, those skilled in the art can understand that various modifications can be made to examples for realizing the method and device.

Figure 1:
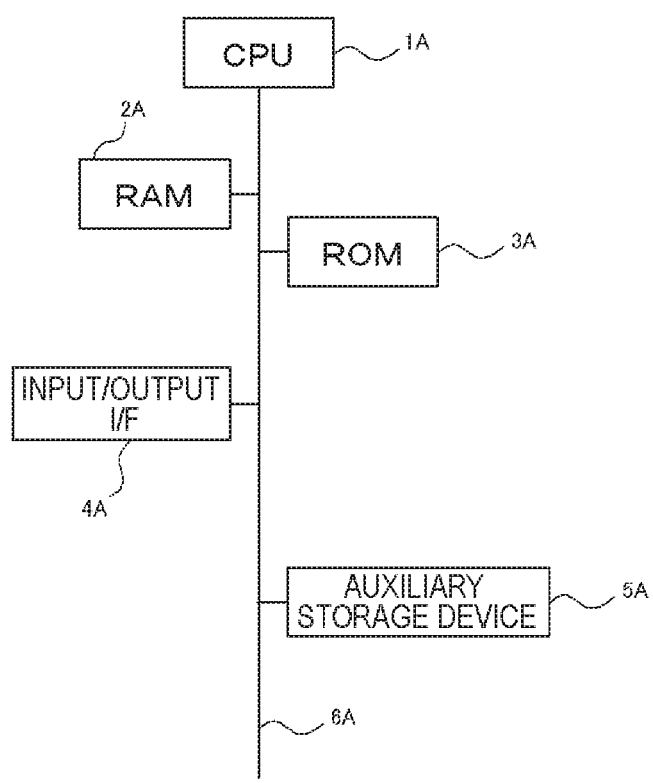
FIG. 1 is a conceptual diagram illustrating an example of a hardware configuration of an apparatus according to the present exemplary embodiment.

FIG. 1 is a conceptual diagram illustrating an example of a hardware configuration of an apparatus according to the present exemplary embodiment. As shown in the drawing, the apparatus according to the present exemplary embodiment includes a CPU 1A, a random access memory (RAM) 2A, a read only memory (ROM) 3A, an input/output interface (I/F) 4A for connection to another device in a wired and/or wireless manner, an auxiliary storage device 5A which is a hard disk, a portable storage medium, or the like, and the like which are connected to each other through, for example, a bus 6A. The input/output I/F 4A may be connected to a user interface device such as a display device or an input device, may be connected to other devices, or may be connected to the Internet or a network such as a local area network (LAN).

Meanwhile, functional block diagrams used in the following description of the exemplary embodiment indicate function-based blocks rather than hardware-based configurations. In the functional block diagrams, a description is given such that each device is realized by one item of equipment, but means for the realization is not limited thereto. That is, each device may be configured to be physically or logically divided.

First Exemplary Embodiment

A monitoring apparatus according to the present exemplary embodiment automatically generates reference data (teacher data), which is used in a technique for estimating an operating state of an electrical device by comparing a feature amount (reference data) of each of a plurality of electrical devices which is stored in advance and/or a feature amount (reference data) obtained by combining the feature amounts with a feature amount extracted from waveform data such as a current consumption, a power consumption, or an input voltage which is measured, from waveform data (for example, a current consumption, a power consumption, or an input voltage) which is measured in daily life, and stores the generated data. Hereinafter, the details thereof will be described.

Figure 2:
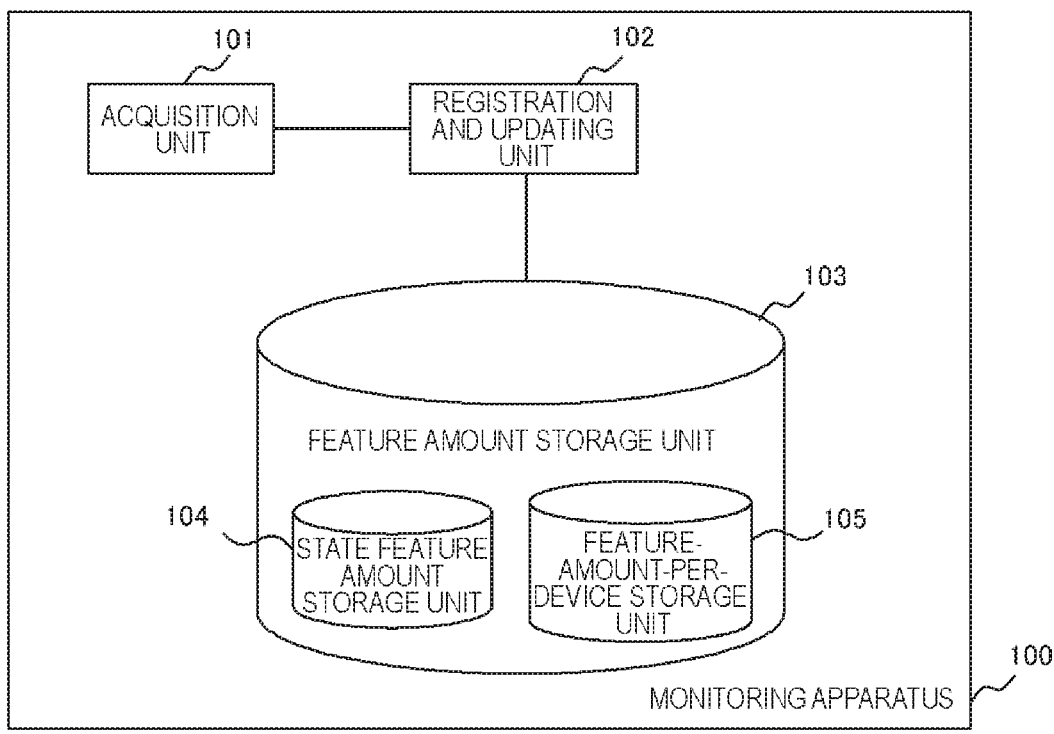
FIG. 2 is an example of a functional block diagram of a monitoring apparatus according to the present exemplary embodiment.

FIG. 2 illustrates an example of a functional block diagram according to the present exemplary embodiment. As shown in the drawing, a monitoring apparatus 100 according to the present exemplary embodiment includes an acquisition unit 101, a registration and updating unit 102, and a feature amount storage unit 103. The feature amount storage unit 103 includes at least one of a state feature amount storage unit 104 and a feature-amount-per-device storage unit 105. Hereinafter, each unit will be described.

The acquisition unit 101 acquires first time-series data which is time-series data of a measured value and/or a feature amount related to an electrical device group. It is sufficient if at least the total current consumption, total power consumption, or total input voltage are measured for the electrical device group. For example, the electrical device group may be a plurality of electrical devices that receive power through one distribution board, may be a plurality of electrical devices that receive power through one plug socket, may be a plurality of electrical devices that receive power through one multisocket, or may be another unit.

The measured value may change due to a change (for example, switching between an on-state and an off-state of a power supply) in an operating state of one device in the electrical device group. Examples of the measured value include a total current consumption, a total power consumption, and a total input voltage of the electrical device group, and the temperature or quantity of heat of a distribution board distributing power to the electrical device group, a plug socket, a multisocket, or the like. For example, the first time-series data constituted by such measured values can be acquired by installing a predetermined measurement device in the distribution board, the plug socket, the multisocket, or the like and using the measurement device.

The feature amount is extracted from any waveform data among a total current consumption, a total power consumption, and a total input voltage of the electrical device group. For example, the feature amount may be a frequency intensity and phase (harmonic component) of a current consumption, a phase, a change in current consumption, an average value, a peak value, an effective value, a crest factor, a form factor, a convergence time of a current change, an energizing time, the position of a peak, a time difference between a peak position of a power supply voltage and a peak position of a current consumption, a power factor, or the like. For example, the first time-series data constituted by such a feature amount is obtained by installing a predetermined measurement device in a distribution board, a plug socket, a multisocket, or the like, acquiring predetermined waveform data using the measurement device, and extracting a predetermined feature amount from the waveform data.

The registration and updating unit 102 specifies a pre-state-change data value and a post-state-change data value, in the first time-series data, in which a difference in values between the pre-state-change data value which is any one of a data value at a first point in time in the first time-series data and a statistic of a plurality of data values from a point in time earlier than the first point in time by a predetermined period of time to the first point in time and the post-state-change data value which is any one of a data value at a second point in time later than the first point in time and a statistic of a plurality of data values from the second point in time to a point in time later than the second point in time by a predetermined period of time satisfies a predetermined condition. The registration and updating unit 102 stores a feature amount extracted from any waveform data from a total current consumption, a total power consumption, and a total input voltage of the electrical device group corresponding to the pre-state-change data value and the post-state-change data value which satisfy the predetermined condition, in the feature amount storage unit 103. Hereinafter, the details thereof will be described.

Figure 3:
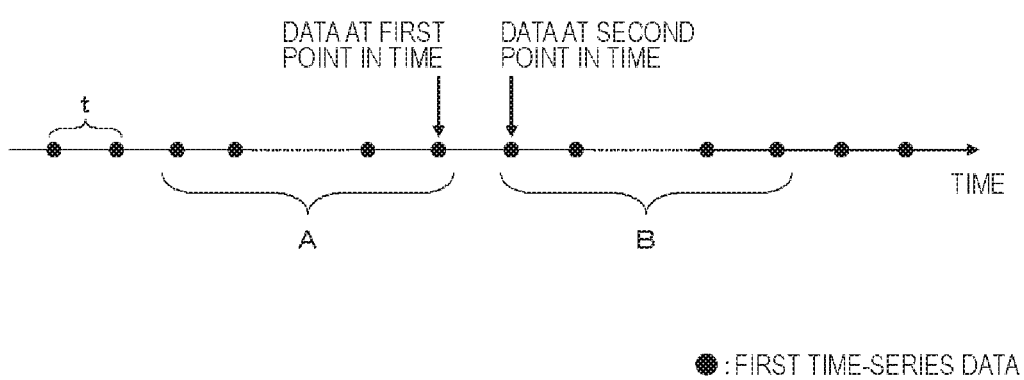
FIG. 3 is a diagram illustrating a definition related to first time-series data.

First, a pre-state-change data value and a post-state-change data value will be described with reference to FIG. 3. FIG. 3 illustrates first time-series data. Data at each point in time is schematically indicated by a black circle. The pieces of data are pieces of time-series data at intervals of time t. Data positioned closer to the left side in the drawing is data measured at an earlier timing.

Data at a first point in time shown in the drawing is any one piece of data included in the pieces of first time-series data. Data at a second point in time is data positioned temporally later (for example, one piece of data later) than data at the first point in time in the pieces of first time-series data. The data at the first point in time and the data at the second point in time may be temporally adjacent to each other in the first time-series data.

In the drawing, a plurality of pieces of data A are a plurality of pieces of data from a point in time earlier than the first point in time by a predetermined period of time (matter of design) to the first point in time. A plurality of pieces of data B are a plurality of pieces of data from the second point in time to a point in time later than the second point in time by a predetermined period of time (matter of design).

The "pre-state-change data" is data at the first point in time or the plurality of pieces of data A. The "post-state-change data" is data at the second point in time or the plurality of pieces of data B.

When the pre-state-change data is data at the first point in time, the value of the data at the first point in time is a "pre-state-change data value". On the other hand, when the pre-state-change data is the plurality of pieces of data A, a statistic of the values of the plurality of pieces of data A is a "pre-state-change data value". The statistic may be set to be an average value, a median, a most frequent value, or the like.

Similarly, when the post-state-change data is data at the second point in time, the value of the data at the second point in time is a "post-state-change data value". On the other hand, when the post-state-change data is a plurality of pieces of data B, a statistic of the values of the plurality of pieces of data B is a "post-state-change data value". The statistic may be set to be an average value, a median, a most frequent value, or the like.

A combination of the pre-state-change data value and the post-state-change data value includes the following four patterns; (value of data at the first point in time, value of data at the second point in time), (value of data at the first point in time, statistic of values of the plurality of pieces of data B), (statistic of values of the plurality of pieces of data A, value of data at the second point in time), (statistic of values of the plurality of pieces of data A, statistic of values of the plurality of pieces of data B).

The registration and updating unit 102 specifies a piece of pre-state-change data and a piece of post-state-change data, within first time-series data, in which a difference in values between the pre-state-change data value and the post-state-change data value satisfies a predetermined condition. In the predetermined condition, for example, an absolute value of the difference in values is equal to or greater than a predetermined threshold value (or is larger than the predetermined threshold value). The threshold value may be set in advance.

A boundary between a first point in time and a second point in time at which a measured value or a feature amount changes to a predetermined level (predetermined threshold value) or more can be determined to be a boundary at which an operating state of the electrical device has changed. By appropriately setting the predetermined threshold value, it is possible to detect a boundary in which switching between an on-state and an off-state of a power supply of the electrical device is performed, or the like.

Meanwhile, when the pre-state-change data value is set to be a statistic of the values of the plurality of pieces of data A, it is possible to reduce the influence of a noise component compared to a case of being set to be a value of data at the first point in time. As a result, it is possible to increase accuracy for detecting a boundary (boundary of switching between an on-state and an off-state of a power supply) in which an operating state of the electrical device has changed. Similarly, when the post-state-change data value is set to be a statistic of values of the plurality of pieces of data B, it is possible to reduce the influence of a noise component compared to a case of being set to be a value of data at the second point in time. As a result, it is possible to increase accuracy for detecting a boundary (boundary of switching between an on-state and an off-state of a power supply) in which an operating state of the electrical device has changed.

When the registration and updating unit 102 analyzes the first time-series data and specifies a timing when an operating state of the electrical device has changed, the registration and updating unit stores a feature amount extracted from any waveform data of a total current consumption, a total power consumption, and a total input voltage of an electrical device group corresponding to the timing (timing when the pre-state-change data value and the post-state-change data value which satisfy the predetermined condition are measured), in the feature amount storage unit 103. The wording "waveform data corresponding to the timing when the pre-state-change data value and the post-state-change data value which satisfy the predetermined condition are measured" as used herein refers to waveform data having a predetermined length which includes a portion measured at the timing. The first time-series data and the waveform data may be configured such that the measurement timings thereof can be associated with each other by a measurement time or the like.

For example, the registration and updating unit 102 may execute at least one of the following three processes.

Process of storing a difference in values between a feature amount extracted from waveform data of a portion corresponding to the pre-state-change data value (portion corresponding to pre-state-change data) and a feature amount extracted from waveform data of a portion corresponding to the waveform data (portion corresponding to post-state-change data) in the feature-amount-per-device storage unit 105 as a feature amount of a first electrical device.

Process of storing a feature amount extracted from waveform data of a portion corresponding to the pre-state-change data value (portion corresponding to pre-state-change data) in the state feature amount storage unit 104 as a feature amount of a first electrical device group.

Process of storing a feature amount extracted from waveform data of a portion corresponding to the post-state-change data value (portion corresponding to post-state-change data) in the state feature amount storage unit 104 as a feature amount of a second electrical device group.

Hereinafter, examples of such processes will be described. The first time-series data includes a plurality of boundaries in which operating states of electrical devices have changed (for example, a boundary of switching between an on-state and an off-state of a power supply), that is, a plurality of combinations of the pre-state-change data value (pre-state-change data) and post-state-change data value (post-state-change data) which satisfy the predetermined condition. Consequently, the first time-series data is divided at the boundaries in which operating states of the electrical devices have changed into a plurality of groups (hereinafter, "common electrical-device-state groups"). Predetermined feature amounts are extracted from a plurality of pieces of the waveform data corresponding to the respective plurality of common electrical-device-state groups, and the predetermined feature amounts may be stored in the state feature amount storage unit 104 as feature amounts of a plurality of electrical device groups. In addition, difference values between feature amounts of two temporally sequential groups is calculated, and the difference values may be stored in the feature-amount-per-device storage unit 105 as feature amounts of the electrical devices.

Meanwhile, when the acquisition unit 101 acquires pieces of time-series data of a plurality of types of feature amount as first time-series data, the registration and updating unit 102 may execute the above-mentioned processes using each of the pieces of time-series data of the plurality of types of feature amount. For example, the registration and updating unit 102 divides the first time-series data at boundaries in which operating states of electrical devices have changed as described above into a plurality of groups (hereinafter, "common electrical-device-state groups"). A statistic (average value, median, most frequent value, or the like) of pieces of data (feature amounts) included in each group is calculated for each group, and the statistics may be stored in the feature amount storage unit 103 as feature amounts of a plurality of electrical device groups. In addition, difference values between feature amounts of two temporally sequential groups may be calculated, and the difference values may be stored in the feature amount storage unit 103 as feature amounts of the electrical devices.

FIG. 4 schematically illustrates an example of information stored in the feature-amount-per-device storage unit 105. The feature-amount-per-device storage unit 105 shown in the drawing stores a feature amount registered by the registration and updating unit 102 in association with a serial number.

As described above, when the pre-state-change data and the post-state-change data satisfy the above-mentioned predetermined condition, the first point in time and the second point in time can be determined to be a boundary (boundary of switching between an on-state and an off-state of a power supply) in which an operating state of the electrical device has changed. That is, it can be determined that there is one electrical device that operates at at least one point in time of a point in time before the first point in time and a point in time after the second point in time and does not operate at the other point in time. In the present exemplary embodiment, when pre-state-change data and post-state-change data satisfying the above-mentioned predetermined condition are present, a difference in values between feature amounts extracted from pieces of waveform data corresponding to the pre-state-change data and the post-state-change data is stored in the feature-amount-per-device storage unit 105, and thus it is possible to efficiently collect feature amounts of the respective electrical devices which are actually used in each unit (for example, each household or each building).

In addition, combinations of operating electrical devices may be different from each other at the first point in time and the second point in time. Both a combination of the first points in time and a combination of the second points in time are combinations of electrical devices which are actually used in each unit (for example, each household or each building). In the present exemplary embodiment, when pre-state-change data and post-state-change data satisfying the above-mentioned predetermined condition are present, at least one of a feature amount extracted from waveform data corresponding to the pre-state-change data and a feature amount extracted from waveform data corresponding to the post-state-change data is stored in the state feature amount storage unit 104, and thus it is possible to efficiently correct feature amounts of combinations of electrical devices which are actually used in each unit (for example, each household or each building).

Incidentally, the above-mentioned processes performed by the monitoring apparatus 100 may be real-time processes or may be batch processes. In addition, the first time-series data may be associated with time information. When the first time-series data is time-series data of a current consumption or time-series data of a power consumption, a measurement time may be associated with each piece of data (current value, power value). In addition, when the first time-series data is time-series data of a feature amount which is calculated on the basis of time-series data of a current consumption or time-series data of a power consumption, a measurement time of waveform data used for the calculation may be associated with each feature amount. The premise is the same in all of the following exemplary embodiments.

Second Exemplary Embodiment

A functional block diagram of a monitoring apparatus 100 according to the present exemplary embodiment is shown in FIG. 2 similar to the first exemplary embodiment. The monitoring apparatus 100 according to the present exemplary embodiment is based on the configuration of the monitoring apparatus 100 according to the first exemplary embodiment, and a configuration of a registration and updating unit 102 is different from that in the first exemplary embodiment. Hereinafter, a description thereof will be given.

When pre-state-change data and post-state-change data satisfying the above-mentioned predetermined condition are present in first time-series data, the registration and updating unit 102 updates a feature amount storage unit 103.

Specifically, when a feature amount approximating to a feature amount, to a predetermined level or higher, extracted from waveform data corresponding to pre-state-change data and post-state-change data which are newly specified is already registered in the feature amount storage unit 103, the registered feature amount is changed (updated) to a new value. For example, the registered feature amount is rewritten as an average value of two or more feature amounts which approximate to each other. How a predetermined level of the approximation is determined is a matter of design.

According to the present exemplary embodiment, a feature amount stored in the feature amount storage unit 103 is not fixed to a value acquired once from measured data, and can be corrected (averaged, or the like) to a value acquired thereafter. For this reason, when a feature amount includes a noise component, it is possible to reduce the noise component. Meanwhile, there is a low probability that a noise component is included, and thus the influence of noise is reduced as the number of correction processes increases.

Third Exemplary Embodiment

A functional block diagram of a monitoring apparatus 100 according to the present exemplary embodiment is shown in FIG. 2 similar to the first exemplary embodiment. The monitoring apparatus 100 according to the present exemplary embodiment is based on the configuration of the monitoring apparatus 100 according to the first exemplary embodiment, and a configuration of a registration and updating unit 102 is different from that in the first exemplary embodiment. Hereinafter, a description thereof will be given.

When pre-state-change data and post-state-change data satisfying the above-mentioned predetermined condition are present in first time-series data, the registration and updating unit 102 confirms whether a feature amount approximating to a feature amount, to a predetermined level or higher, extracted from waveform data corresponding to pre-state-change data and post-state-change data which are newly specified is stored in a feature amount storage unit 103. When the feature amount is not stored in the feature amount storage unit, the registration and updating unit stores the feature amount in the feature amount storage unit 103 as described in the first exemplary embodiment. On the other hand, when the feature amount is stored in the feature amount storage unit, the registration and updating unit updates the feature amount storage unit 103 as described in the second exemplary embodiment.

According to the present exemplary embodiment, it is possible to perform a process of registering a feature amount and a process of updating a feature amount in parallel.

Fourth Exemplary Embodiment

Figure 5:
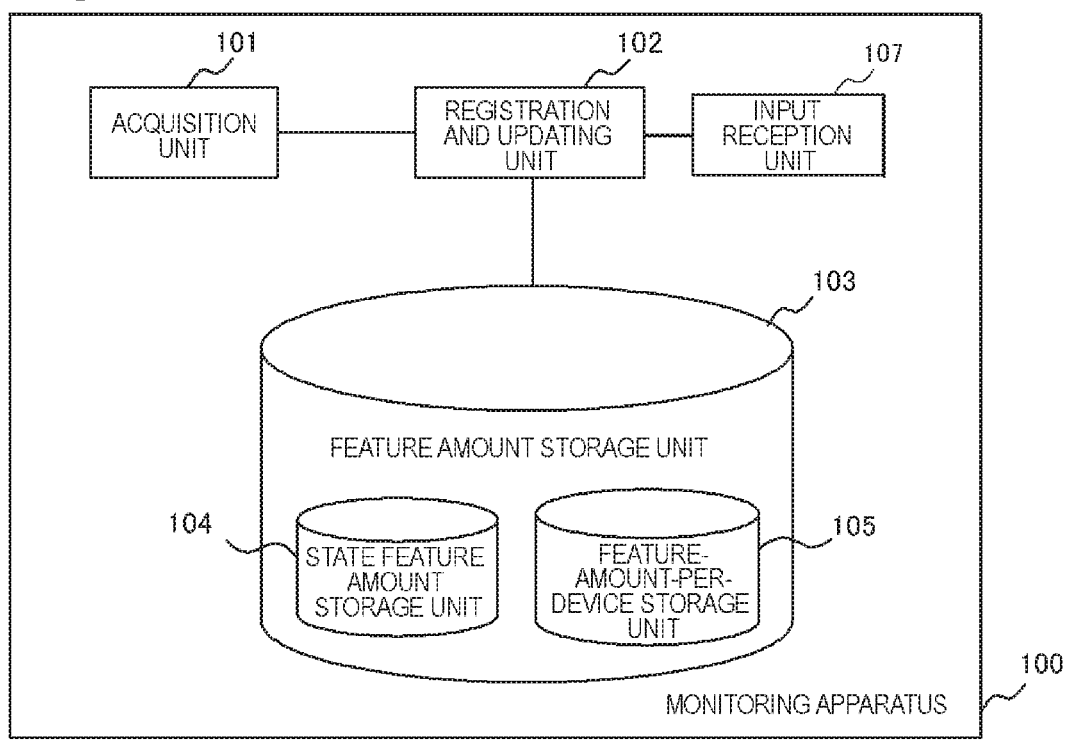
FIG. 5 is an example of a functional block diagram of the monitoring apparatus according to the present exemplary embodiment.

FIG. 5 illustrates an example of a functional block diagram of a monitoring apparatus 100 according to the present exemplary embodiment. As shown in the drawing, the monitoring apparatus 100 according to the present exemplary embodiment includes an acquisition unit 101, a registration and updating unit 102, a feature amount storage unit 103, and an input reception unit 107. The feature amount storage unit 103 includes at least one of a state feature amount storage unit 104 and a feature-amount-per-device storage unit 105. A configuration of the acquisition unit 101 is the same as those in the first to third exemplary embodiments.

When pre-state-change data and post-state-change data satisfying the above-mentioned predetermined condition are present, the input reception unit 107 receives a user input of information for identifying an electrical device having a power supply switched between an on-state and an off-state during a change from a state when the pre-state-change data is measured (first state) to a state when the post-state-change data is measured (second state). Means for receiving a user input is not particularly limited, and the reception of a user input can be realized using an input device and an output device of the related art.

Hereinafter, a description will be given of an example in which the input reception unit 107 receives a user input by division into a case of the process of the monitoring apparatus 100 being a real-time process and a case of the process being a batch process.

Figure 6:
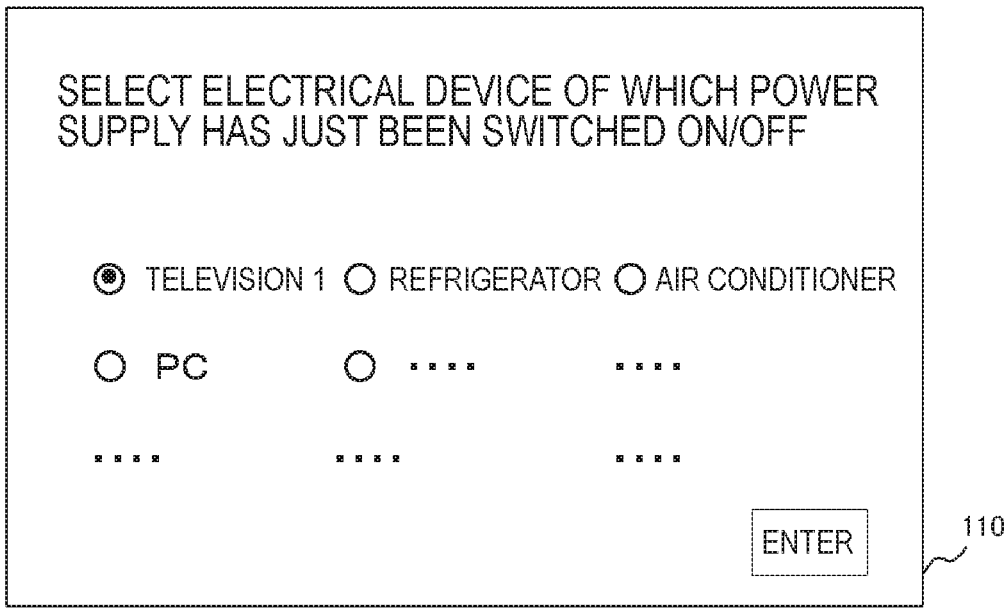
FIG. 6 is a diagram illustrating an example of an input screen on which an input reception unit receives a user input.

When pre-state-change data and post-state-change data satisfying the above-mentioned predetermined condition are extracted in a case where the process of the monitoring apparatus 100 is a real-time process, the input reception unit 107 may display an input reception screen as illustrated in FIG. 6 using the pieces of data as triggers. The screen illustrated in FIG. 6 is a "screen for selecting and inputting a type of the electrical device of which a power supply has just been switched between an on-state and an off-state". The screen has a plurality of electrical devices listed thereon and is configured such that one of the electrical devices can be selected. The input reception unit 107 displays the screen, and may notify a user that the screen is displayed and is in an input standby state by using any notification means such as sound, light, or vibration.

When the input reception unit 107 receives a user input of information for identifying an electrical device from the screen as illustrated in FIG. 6, the registration and updating unit 102 stores the input identification information in the feature-amount-per-device storage unit 105 in association with a feature amount of a first electrical device which is calculated on the basis of pre-state-change data and post-state-change data serving as triggers for displaying the screen in which the input is received. FIG. 7 schematically illustrates an example of information stored in the feature-amount-per-device storage unit 105 according to the present exemplary embodiment.

On the other hand, when pre-state-change data and post-state-change data satisfying the above-mentioned predetermined condition are extracted in a case where the process of the monitoring apparatus 100 is a batch process, the registration and updating unit 102 stores a feature amount of a first electrical device which is calculated on the basis of the pre-state-change data and the post-state-change data in the feature-amount-per-device storage unit 105 in association with a time at a first point in time or a second point in time. As described in the first exemplary embodiment, first time-series data can be associated with time information. FIG. 8 schematically illustrates another example of information stored in the feature-amount-per-device storage unit 105 according to the present exemplary embodiment. A data acquisition date and time shown in the drawing is a time at a first point in time or a second point in time.

The input reception unit 107 may display an input reception screen as illustrated in FIG. 9 at a predetermined timing using information stored in the feature-amount-per-device storage unit 105 as illustrated in FIG. 8. The screen illustrated in FIG. 9 is a "screen for selecting and inputting a type of the electrical device of which a power supply was switched between an on-state and an off-state at a predetermined time". The predetermined time is a time at a first point in time or a second point in time, and the display of the information thereof is performed using information (data acquisition date and time of FIG. 8) which is stored in the feature-amount-per-device storage unit 105. The screen has a plurality of electrical devices listed thereon and is configured such that one of the electrical devices can be selected.

When the input reception unit 107 receives a user input of information for identifying an electrical device from the screen as illustrated in FIG. 9, the registration and updating unit 102 stores the input identification information in the feature-amount-per-device storage unit 105 in association with a feature amount associated with the predetermined time displayed on the input screen (see FIG. 8).

According to the present exemplary embodiment, it is possible to exhibit the same operational effects as those in the first to third exemplary embodiments. In addition, it is possible to associate a feature amount generated from first time-series data with a type of an electrical device having the feature amount.

Meanwhile, the input reception unit 107 may further receive at least one of information for identifying a plurality of electrical devices operating during a first state and information for identifying a plurality of electrical devices operating during a second state.

Hereinafter, a description will be given of an example in which the input reception unit 107 receives a user input by division into a case of the process of the monitoring apparatus 100 being a real-time process and a case of the process being a batch process.

Figure 13:
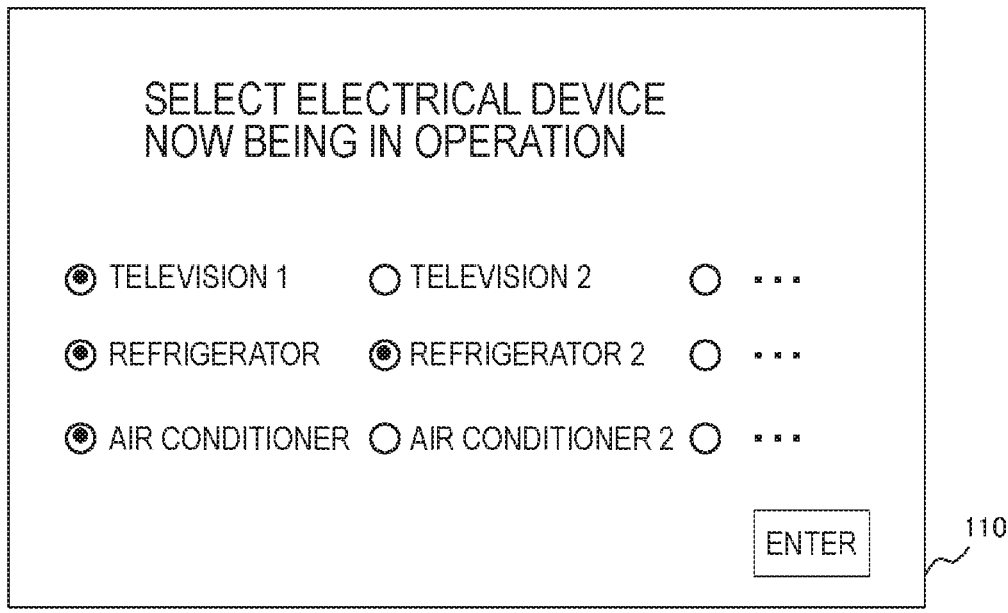
FIG. 13 is a diagram illustrating an example of an input screen on which an input reception unit receives a user input.

When pre-state-change data and post-state-change data satisfying the above-mentioned predetermined condition are extracted in a case where the process of the monitoring apparatus 100 is a real-time process, the input reception unit 107 may display an input reception screen as illustrated in FIG. 13 using the pieces of data as triggers. The screen illustrated in FIG. 13 is a "screen for selecting and inputting a type of an electrical device which is now in operation". The term "now" as used herein corresponds to a "second state". The screen has a plurality of electrical devices listed thereon and is configured such that one or more electrical devices can be selected. The input reception unit 107 displays the screen, and may notify a user that the screen is displayed and is in an input standby state by using any notification means such as sound, light, or vibration.

When the input reception unit 107 receives a user input of information for identifying an electrical device from the screen as illustrated in FIG. 13, the registration and updating unit 102 stores the input identification information in the state feature amount storage unit 104 in association with a feature amount extracted from post-state-change data serving as a trigger for displaying the screen in which the input is received. FIG. 14 schematically illustrates an example of information stored in the state feature amount storage unit 104 according to the present exemplary embodiment.

On the other hand, when pre-state-change data and post-state-change data satisfying the above-mentioned predetermined condition are extracted in a case where the process of the monitoring apparatus 100 is a batch process, the registration and updating unit 102 stores a feature amount extracted from each of the pieces of data in the state feature amount storage unit 104 in association with a time period in which each state is maintained. Means for specifying a time period in which each state is maintained is not particularly limited. For example, when a plurality of boundaries (boundaries of switching between an on-state and an off-state of a power supply) at which an operating state of the electrical device has changed are extracted in first time-series data, a time period between the boundaries can be determined to be a time period in which any state is maintained. As described in the first exemplary embodiment, the first time-series data can be associated with time information. FIG. 15 schematically illustrates another example of information stored in the state feature amount storage unit 104 according to the present exemplary embodiment. A data acquisition date and time illustrated in the drawing indicates a time period in which each state is maintained.

The input reception unit 107 may display an input reception screen as illustrated in FIG. 16 at a predetermined timing using information stored in the state feature amount storage unit 104 as illustrated in FIG. 15. The screen illustrated in FIG. 16 is a "screen for selecting and inputting a type of an electrical device which was in operation at a predetermined time". The predetermined time is any time in a time period in which each state is maintained, and the display of the information is realized using information (data acquisition date and time of FIG. 15) which is stored in the state feature amount storage unit 104. The screen has a plurality of electrical devices listed thereon and is configured such that one or more electrical devices can be selected.

When the input reception unit 107 receives a user input of information for identifying an electrical device from the screen as illustrated in FIG. 16, the registration and updating unit 102 stores the input identification information in the state feature amount storage unit 104 in association with a feature amount associated with a predetermined time displayed on the input screen (see FIG. 15).

In this manner, according to the present exemplary embodiment, it is possible to associate a type of an electrical device being in operation with a feature amount in a state where a plurality of electrical devices are operating.

Fifth Exemplary Embodiment

Figure 10:
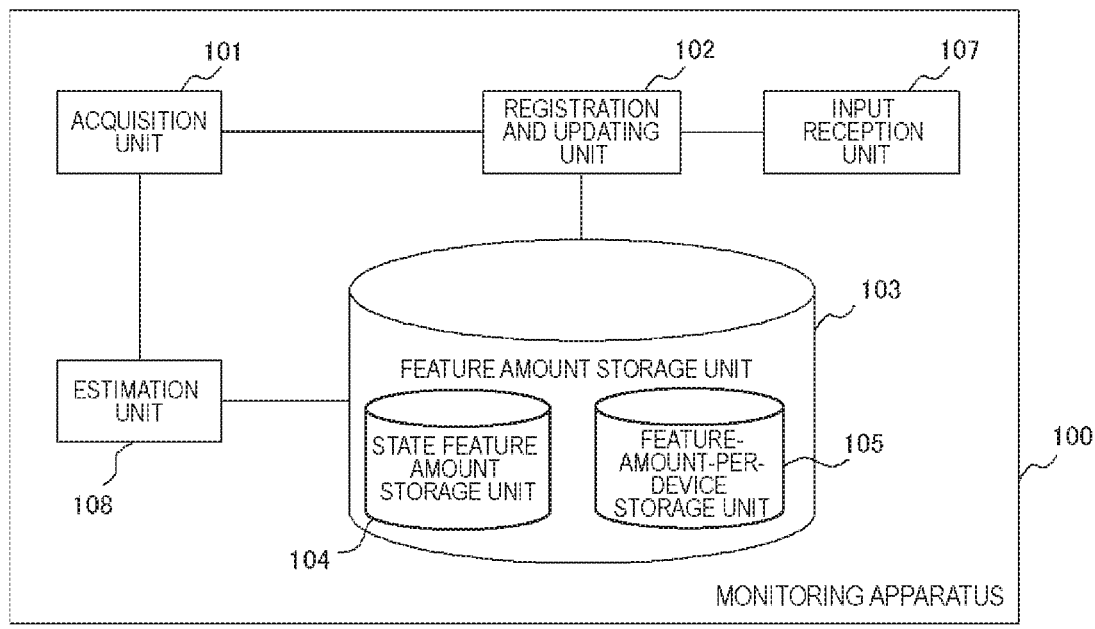
FIG. 10 is an example of a functional block diagram of the monitoring apparatus according to the present exemplary embodiment.

FIG. 10 illustrates an example of a functional block diagram of a monitoring apparatus 100 according to the present exemplary embodiment. As shown in the drawing, the monitoring apparatus 100 according to the present exemplary embodiment includes an acquisition unit 101, a registration and updating unit 102, a feature amount storage unit 103, and an estimation unit 108. The feature amount storage unit 103 includes at least one of a state feature amount storage unit 104 and a feature-amount-per-device storage unit 105. Meanwhile, the monitoring apparatus may further include an input reception unit 107. Configurations of the acquisition unit 101, the registration and updating unit 102, the feature amount storage unit 103, and the input reception unit 107 are the same as those in the first to fourth exemplary embodiments.

The estimation unit 108 estimates an operating state of an electrical device group within a predetermined unit (for example, a household, a building, and the like) using a feature amount stored in the feature amount storage unit 103 and a feature amount extracted from any waveform data of a total current consumption, a total power consumption, and a total input voltage of the electrical device group which are acquired by the acquisition unit 101. That is, the estimation unit 108 estimates which electrical device is in operation (on-state of a power supply) by comparing one of feature amounts of respective electrical devices which are stored in the feature-amount-per-device storage unit 105, a total feature amount obtained by arbitrarily combining (for example, adding) the feature amounts, or one of feature amounts in respective states which are stored in the state feature amount storage unit 104 with a feature amount extracted from the waveform data. The above-mentioned process performed by the estimation unit 108 is the same as those disclosed in Patent Documents 2 to 4, and thus a detailed description thereof will be omitted here. Meanwhile, it is preferable that the estimation unit 108 performs the above-mentioned process using data which is acquired by the acquisition unit 101 in real time.

The monitoring apparatus 100 is not shown in FIG. 10, but may include an output unit that outputs estimation results of the estimation unit 108. The output unit can output estimation results through any output device such as a display, an e-mail, a printer, or a speaker.

Figure 12:
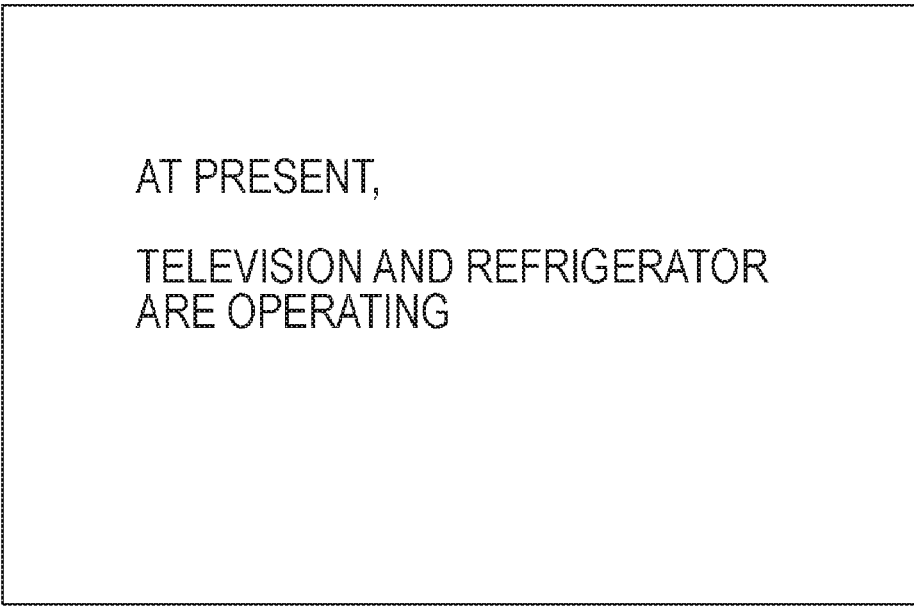
FIG. 12 is a diagram illustrating an example in which an estimation result of an operating state of an electrical device is displayed on a display.

Incidentally, when the feature-amount-per-device storage unit 105 stores feature amounts as illustrated in FIG. 7, that is, when each feature amount is associated with a type of an electrical device (device information), the estimation unit 108 can estimate a type of an electrical device which is in operation (on-state of a power supply) as an estimation result. For example, when a total feature amount, which is obtained by adding up feature amounts of serial number 0001 (associated device information: television) and serial number 0003 (associated device information: refrigerator), and a feature amount extracted from the above-mentioned waveform data match each other, the estimation unit 108 can estimate that the television and the refrigerator are in operation. The output unit may display, for example, information as illustrated in FIG. 12 on a display 110.

Figure 11:
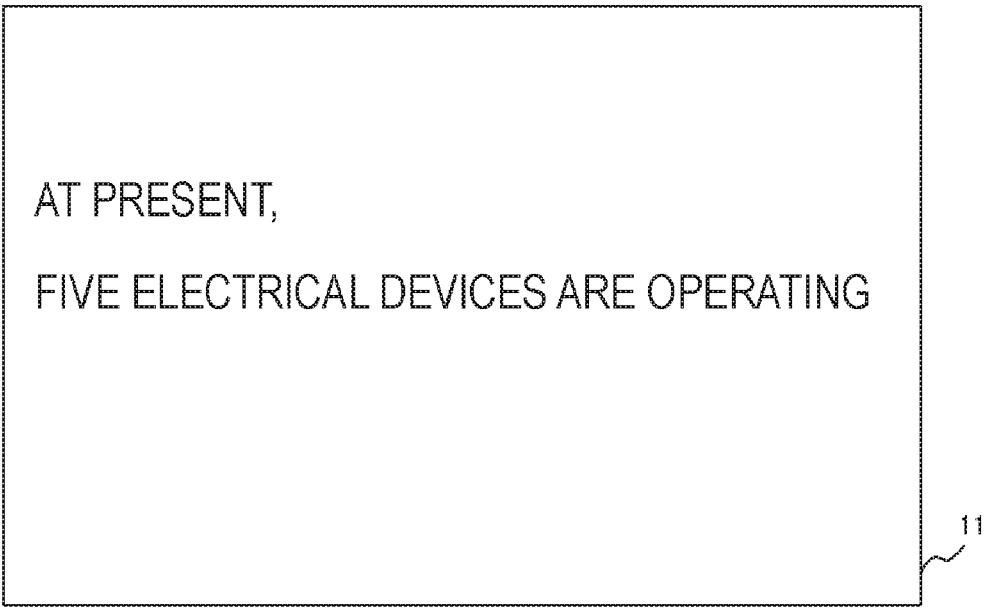
FIG. 11 is a diagram illustrating an example in which an estimation result of an operating state of an electrical device is displayed on a display.

On the other hand, when the feature-amount-per-device storage unit 105 stores feature amounts as illustrated in FIG. 4, that is, when a type of an electrical device is not associated with each feature amount, the estimation unit 108 may estimate the number of electrical devices which are in operation (on-state of a power supply) instead of estimating a type of an electrical device which is in operation. For example, when a total feature amount obtained by adding up a feature amount of serial number 0001 and feature amounts of serial numbers 0003 to 0006 and a feature amount extracted from the above-mentioned waveform data match each other, the estimation unit 108 can estimate that five electrical devices are in operation. The output unit may display, for example, information as illustrated in FIG. 11 on the display 110.

According to the present exemplary embodiment, it is possible to exhibit the same operational effects as those in the first to fourth exemplary embodiments. In addition, it is possible to estimate a current operating state of the electrical device and to provide an estimation result to a user.

Sixth Exemplary Embodiment

FIG. 10 illustrates an example of a functional block diagram of a monitoring apparatus 100 according to the present exemplary embodiment. As shown in the drawing, the monitoring apparatus 100 according to the present exemplary embodiment includes an acquisition unit 101, a registration and updating unit 102, a feature amount storage unit 103, and an estimation unit 108. The feature amount storage unit 103 includes a state feature amount storage unit 104 and a feature-amount-per-device storage unit 105. Meanwhile, the monitoring apparatus may further include an input reception unit 107. Configurations of the acquisition unit 101, the registration and updating unit 102, the feature amount storage unit 103, and the input reception unit 107 are the same as those in the first to fifth exemplary embodiments.

The configuration of the estimation unit 108 is different from those in the first to fifth exemplary embodiments in that an operating state of an electrical device is estimated using a feature amount stored in the feature-amount-per-device storage unit 105 when the same state cannot be specified after first performing a process of estimating an operating state of an electrical device using a feature amount stored in the state feature amount storage unit 104, that is, when a matching feature amount is not stored in the state feature amount storage unit 104 in a process of estimating operating states of a plurality of electrical devices within a predetermined unit (for example, a household, a building, and the like) on the basis of a feature amount which is stored in the feature amount storage unit 103 and a feature amount which is extracted from waveform data acquired by the acquisition unit 101. The other configurations are the same as those in the first to fifth exemplary embodiments.

Figure 17:
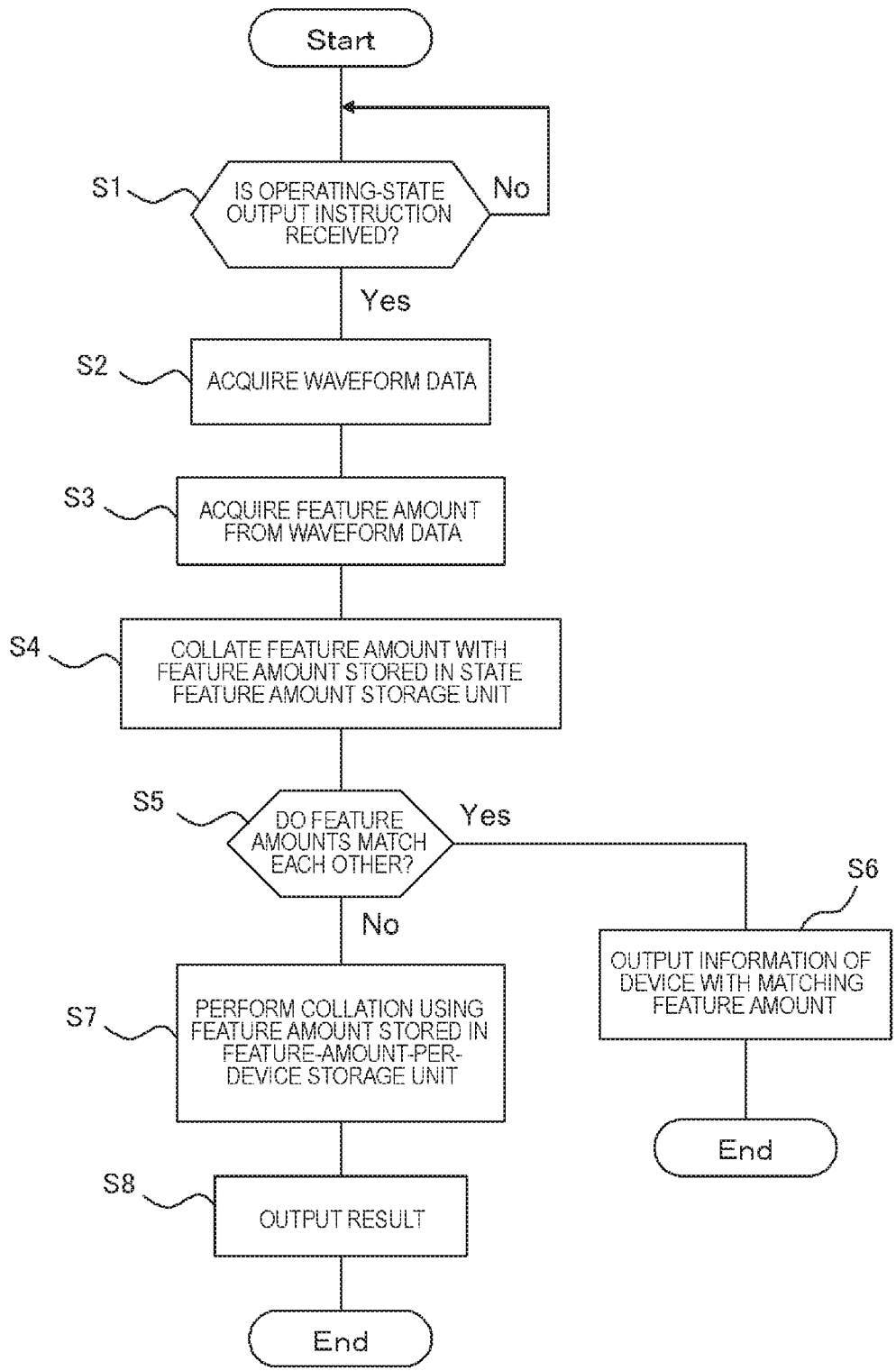
FIG. 17 is a flowchart illustrating an example of a flow of a process of the monitoring apparatus according to the present exemplary embodiment.

An example of a flow of a process of estimating an operating state of an electrical device in the monitoring apparatus 100 according to the present exemplary embodiment will be described below with reference to a flowchart of FIG. 17.

First, the monitoring apparatus 100 is set to be in a standby state for an instruction to output an operating state of an electrical device (S1). The state is maintained until an output instruction is received (No in S1). On the other hand, when the output instruction is received (Yes in S1), the flow proceeds to step S2. The output instruction may be a user input. Alternatively, a predetermined timing (for example, a time (9 o'clock, 12 o'clock, or the like) of day which is determined in advance) which is determined in advance may be observed within the monitoring apparatus 100, and an output instruction may be input at this timing.

In S2, the acquisition unit 101 acquires at least one waveform data of a total current consumption, a total power consumption, and a total input voltage of an electrical device group. Thereafter, in S3, the estimation unit 108 calculates (acquires) a predetermined feature amount from waveform data. In S4, the estimation unit 108 collates the calculated feature amount with a feature amount (see FIG. 14 or 15) which is stored in the state feature amount storage unit 104.

When a matching feature amount is stored in the state feature amount storage unit 104 (Yes in S5), the monitoring apparatus 100 outputs information, indicating that an electrical device associated with the feature amount is in operation, in information stored in the state feature amount storage unit 104 to a user (S6).

On the other hand, when a matching feature amount is not stored in the state feature amount storage unit 104 (No in S5), the estimation unit 108 performs a process of collating a feature amount (see FIG. 4, 8, or 9) which is stored in the feature-amount-per-device storage unit 105 with the feature amount calculated in S3 (S7). The monitoring apparatus 100 outputs an estimation result obtained by the estimation unit 108 to a user (see FIG. 11 or 12).

Here, operational effects of the present exemplary embodiment will be described. When an operating state of an electrical device is estimated using feature amounts of respective electrical devices which are stored in the featureamount-per-device storage unit 105, a total feature amount obtained by adding up feature amounts of any number or any combination of electrical devices is compared with a feature amount which is extracted from waveform data acquired by the acquisition unit 101. When the number of electrical devices is large, patterns for combinations of the electrical devices become huge, which may result in a problem such as an increase in the amount of data to be processed in the collation process, a decrease in a processing speed, or an increase in the load of a computer.

Incidentally, a usage pattern of an electrical device in daily life in each unit (for example, a household, a building, and the like) may be fixed to a certain degree. That is, a type of an electrical device which is frequently used or a combination of electrical devices used at the same time may be fixed. A feature amount in a state which is stored in the state feature amount storage unit 104 is a feature amount in an operating state of an electrical device group which is actually used at the same time in each unit (for example, each household or each building). For this reason, it is considered that there is a higher possibility of a feature amount stored in the state feature amount storage unit 104 matching a feature amount extracted from waveform data than other feature amounts included in a total feature amount obtained by arbitrarily combining feature amounts of respective electrical devices which are stored in the feature-amount-per-device storage unit 105.

In the present exemplary embodiment, an operating state of an electrical device is estimated by preferentially using a feature amount stored in the state feature amount storage unit 104, and thus it is possible to reduce the above-described problem such as a decrease in a processing speed or an increase in the load of a computer.

Seventh Exemplary Embodiment

A monitoring apparatus 100 according to the present exemplary embodiment has the same configuration as those of the monitoring apparatuses 100 according to the first to sixth exemplary embodiments, and is different from the monitoring apparatuses according to the first to sixth exemplary embodiments in that a predetermined threshold value used in a process of determining whether a difference in values between a pre-state-change data value and a post-state-change data value is equal to or greater than (or greater than) the predetermined threshold value is set to be a "predetermined multiple of a variance value of values of a plurality of pieces of data A", a "predetermined multiple of a variance value of values of a plurality of pieces of data B", or a "predetermined multiple of a larger value out of the variance value of the values of the plurality of pieces of data A and the variance value of the values of the plurality of pieces of data B". The definition of the plurality of pieces of data A and the definition of the plurality of pieces of data B are as described in the first exemplary embodiment with reference to FIG. 3, and thus a description thereof will be omitted here. Meanwhile, the value of the predetermined multiple is a matter of design.

According to the present exemplary embodiment, it is possible to reduce the influence of a noise component included in first time-series data. As a result, it is possible to increase accuracy for detecting a boundary (boundary of switching between an on-state and an off-state of a power supply) in which an operating state of an electrical device has changed.

Eighth Exemplary Embodiment

Figure 18:
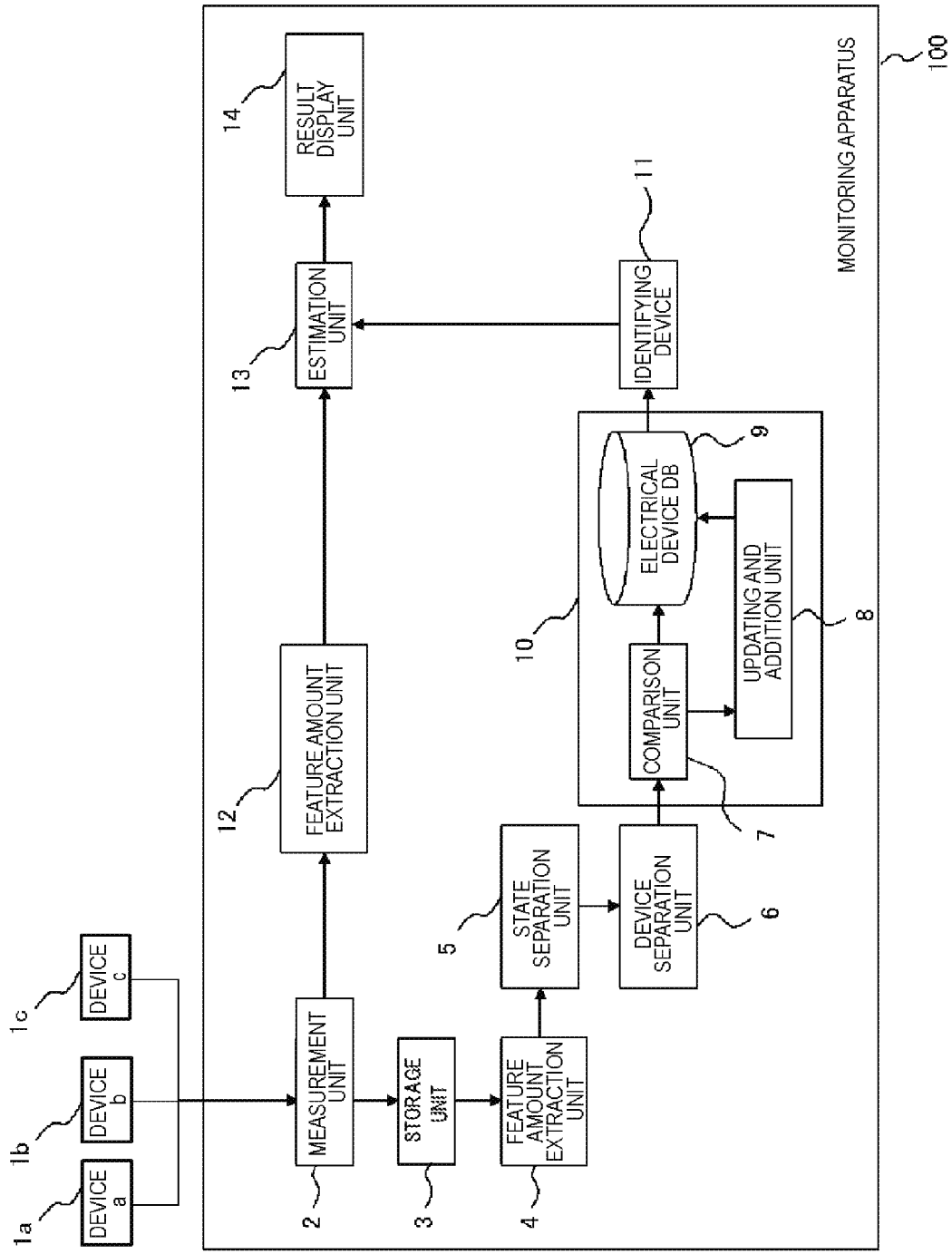
FIG. 18 is an example of a functional block diagram of the monitoring apparatus according to the present exemplary embodiment.

FIG. 18 illustrates an example of a functional block diagram of a monitoring apparatus according to the present exemplary embodiment. As shown in the drawing, a monitoring apparatus 100 includes a measurement unit 2, a storage unit 3, a feature amount extraction unit 4, a state separation unit 5, a device separation unit 6, a database updating and addition system 10, an identifying device 11, a feature amount extraction unit 12, an estimation unit 13, and a result display unit 14. The database updating and addition system 10 includes a comparison unit 7, an updating and addition unit 8, and an electrical device DB 9. An installation position of the monitoring apparatus 100 is not particularly limited, and the monitoring apparatus may be installed within each unit (a household or a building) or may be installed within a data center that collectively manages a plurality of units.

First, the overall configuration of the present exemplary embodiment will be described in detail.

Electrical devices 1a-1c are electrical devices which are connected to a portion located after a branching point. The number of electrical devices is not limited to that shown in the drawing. A measurement unit 2 measures a current waveform and a voltage waveform (hereinafter, a current voltage waveform) which flow through a power supply trunk. Data to be measured here may be data other than the current voltage waveform, for example, an effective current value, an effective voltage value, or a power. The storage unit 3 saves measurement data which is measured by the measurement unit 2. Meanwhile, the measurement data saved in the storage unit 3 may be saved with additional information such as a measurement time or a measurement ID, which enables pieces of measurement data to be distinct from each other. The storage unit 3 may be located within an apparatus including the measurement unit 2, or may be located at a place separated from the apparatus including the measurement unit 2. In the latter case, the measurement data measured by the measurement unit 2 is input to the storage unit 3 through wired and/or wireless communication and is saved therein.

The feature amount extraction unit 4 extracts a feature amount from measurement data saved in the storage unit 3. The feature amount extracted herein may be the intensity or phase of a fundamental wave or a higher harmonic wave, a total power consumption, or the like. In addition, the feature amount may be the measurement data itself measured by the measurement unit 2. Meanwhile, the conversion of the feature amount performed by the feature amount extraction unit 4 may be performed within the measurement device or may be performed at a place separated from the measurement device.

The state separation unit 5 separates feature amounts extracted by the feature amount extraction unit 4 for each operating state of a device. The process corresponds to a process of dividing the first time-series data described in the first exemplary embodiment into common electrical-device-state groups. The state separation unit 5 extracts pre-state-change data and post-state-change data satisfying the above-mentioned first condition from the feature amounts (equivalent to pieces of first time-series data acquired by the acquisition unit 101) which are extracted by the feature amount extraction unit 4. The pieces of first time-series data are separated at a boundary between data at a first point in time and data at a second point in time which are included in the extracted pre-state-change data and post-state-change data, and thus the pieces of first time-series data are separated into common electrical-device-state groups. Thereafter, the state separation unit 5 may calculate a statistic using a plurality of pieces of data included in each of the common electrical-device-state groups. The calculated value may be set as a feature amount of each common electrical-device-state group.

The device separation unit 6 calculates a difference in values between feature amounts of two temporally sequential groups in the first time-series data, which are feature amounts of the common electrical-device-state groups separated by the state separation unit 5, to thereby acquire a feature amount during the operation of an electrical device of which the operating state has changed (on-state/off-state of a power supply) during the transition of the state thereof. The process is equivalent to a process of setting a statistic of values of a plurality of pieces of data of a common electrical-device-state group which include the pre-state-change data to be a pre-state-change representative value and setting a difference in values from a statistic of values of a plurality of pieces of data of a common electrical-device-state group which include post-state-change data to be a post-state-change representative value to thereby calculate a difference in values between the pre-state-change representative value and the post-state-change representative value.

The comparison unit 7 compares feature amounts of electrical devices which are acquired by the device separation unit 6 with feature amounts stored in the electrical device DB (database) 9 to determine whether feature amounts (feature amounts having values that approximate to each other to a predetermined level or higher) of the same electrical device are present. When feature amounts of the same electrical device are present, the updating and addition unit 8 updates the electrical device DB 9. On the other hand, when feature amounts of the same electrical device are not present, the updating and addition unit 8 registers the feature amounts in the electrical device DB 9. The database updating and addition system 10 is a system that continuously operates the comparison unit 7 and the updating and addition unit 8 whenever extracted data is transmitted from the device separation unit 6. Meanwhile, the comparison unit 7 and the updating and addition unit 8 are equivalent to the registration and updating unit 102 described in the above-described exemplary embodiment. The electrical device DB 9 is equivalent to the feature-amount-per-device storage unit 105 described in the above-described exemplary embodiment.

The identifying device 11 creates a predetermined identification function using data saved in the electrical device DB 9, and inputs the created function to the estimation unit 13. The feature amount extraction unit 12 converts measurement data measured by the measurement unit 2 into a feature amount for estimating an operating state of an electrical device. The estimation unit 13 estimates operation conditions or power consumption of each device using a feature amount extracted by the feature amount extraction unit 12 and the identification function obtained by the identifying device 11. The estimation process performed by the estimation unit 13 is performed using a method such as a neural network, but other methods may be used. The identifying device 11 is equivalent to the estimation unit 108 described in the above-described exemplary embodiment. The result display unit 14 displays estimation results obtained by the estimation unit 13 to a user. The display of the estimation results may be performed using any method such as means for directly performing display from a device in a house or means for referring to an external database using a browser or the like.

Since it is not clear which device's state a feature amount saved in the electrical device DB 9 as it is indicates, is preferable to perform association with a device. Examples of a method of performing association include a method of displaying data saved in the electrical device DB 9 to a user using the result display unit 14 and causing the user to directly perform an input operation (equivalent to the configuration of the input reception unit 107 described in the above-described exemplary embodiment), and the like. At this time, the user may determine a device from data which is saved in advance, and thus may not intentionally turn on or turn off the device. In addition, a method may be used in which an electrical device being used is stochastically determined from data such as the form of a current waveform, a power value, a time fluctuation in the intensity of a higher harmonic wave, or a time period in which the feature amount group thereof is used. Further, data such as weather or temperature which is present on a network may be used, or information of a temperature sensor, an optical sensor, or the like which is installed in the vicinity of an electrical device of which the power is estimated may be used.

According to the present exemplary embodiment, it is possible to exhibit the same operational effects as those in the first to seventh exemplary embodiments.

Further, in the data updating system 10, the frequency of detection of data can be measured by comparing a feature amount obtained from measurement data with a feature amount which is present in the existing database, and thus it is possible to perform calculation with a high level of accuracy by using a highly-accurate feature amount and lowering the priority of a feature amount (data of a heater being used for power estimation in summer, or the like) which is not appropriate for power estimation calculation in a season using the frequency of detection in the season.

When an estimator is made using pieces of teacher data of individual devices, it is necessary to consider combinations of on-states and off-states of all of the devices, and thus an extremely complex estimator is made. When "state teacher data which is not actually used" is present, it is possible to omit teacher data which is not required to be learned. When the number of pieces of combined teacher data is small, the number of patterns to be learned decreases, and thus it is possible to make a simpler estimator. Further, when the estimator is made by learning, the accuracy of "teacher data which is actually used" is increased, and thus it is possible to perform calculation with a higher level of accuracy. Therefore, when learning is selectively performed on the basis of the frequency of detection of data, it is possible to perform calculation with a higher level of accuracy.

When data is updated, data which is present in the existing database is compared with measured data. Each piece of measured data includes information indicating how many same pieces of data are present, and thus the information is also saved at the time of saving data in the existing database. Therefore, the existing database can include information indicating how many same pieces of data are present.

Regarding the frequency of detection depending on a season, for example, results obtained by integrating the same frequency of detection for one week (arbitrary herein) are arranged with respect to each week, and a process of not using state data including data of a heater is performed after a week, in which the frequency of use of the heater is 0, for example, in April, is continued a predetermined number of times (for example, three times), thereby allowing the frequency of detection depending on a season and priority to be calculated. This allows such a simple estimator to be made.

Ninth Exemplary Embodiment

Figure 19:
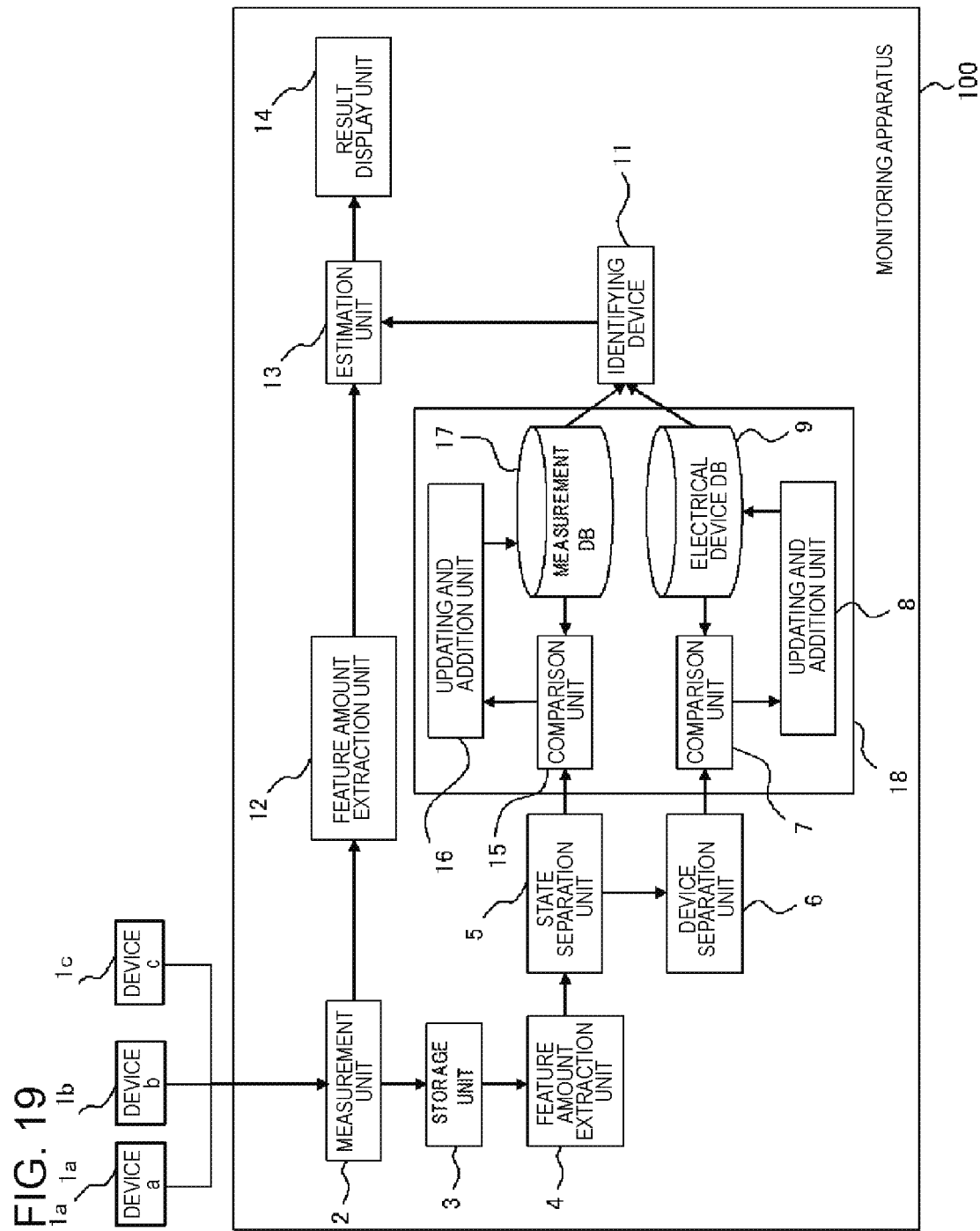
FIG. 19 is an example of a functional block diagram of the monitoring apparatus according to the present exemplary embodiment.

FIG. 19 illustrates an example of a functional block diagram of a monitoring apparatus according to the present exemplary embodiment. As shown in the drawing, a monitoring apparatus 100 according to the present exemplary embodiment is different from the monitoring apparatus 100 (see FIG. 18) according to the eighth exemplary embodiment in that a database updating and addition system 18 further includes a comparison unit 15, an updating and addition unit 16, and a measurement DB 17. Configurations of a measurement unit 2, a storage unit 3, a feature amount extraction unit 4, a state separation unit 5, a device separation unit 6, a comparison unit 7, an updating and addition unit 8, an electrical device DB 9, a feature amount extraction unit 12, and a result display unit 14 are the same as those in the eighth exemplary embodiment.

The comparison unit 15 compares feature amounts (feature amounts of respective common electrical-device-state groups) of a plurality of states which are acquired by the state separation unit 5 with feature amounts stored in the measurement DB 17 to determine whether feature amounts (feature amounts having values that approximate to each other to a predetermined level or higher) in the same state (operating state of an electrical device) are present. When feature amounts in the same state are present, the updating and addition unit 16 updates the measurement DB 17. On the other hand, when feature amounts in the same state are not present, the updating and addition unit 16 registers the feature feature amounts in the measurement DB 17. The database updating and addition system 10 is a system that continuously operates the comparison unit 15 and the updating and addition unit 16 whenever extracted data is transmitted from the device separation unit 6. Meanwhile, the comparison unit 15 and the updating and addition unit 16 are equivalent to the registration and updating unit 102 described in the above-described exemplary embodiment. The measurement DB 17 is equivalent to the state feature amount storage unit 104 described in the above-described exemplary embodiment.

The identifying device 11 and the estimation unit 13 have the same configuration as that of the estimation unit 108 described in the above-described exemplary embodiment.

According to the present exemplary embodiment, it is possible to exhibit the same operational effects as those in the first to eighth exemplary embodiments.

When the above-described exemplary embodiments are used, it is possible to measure not only an operating state of a device, but also the frequency of detection of a measurement state which is present in the measurement DB 17. When the frequency of detection is used, it is possible to perform calculation with a high level of accuracy by lowering the priority of a feature amount (feature amount of a heater being used for power estimation in summer, or the like) which is not appropriate for power estimation calculation in a season using the frequency of detection in the season.

Tenth Exemplary Embodiment

Figure 20:
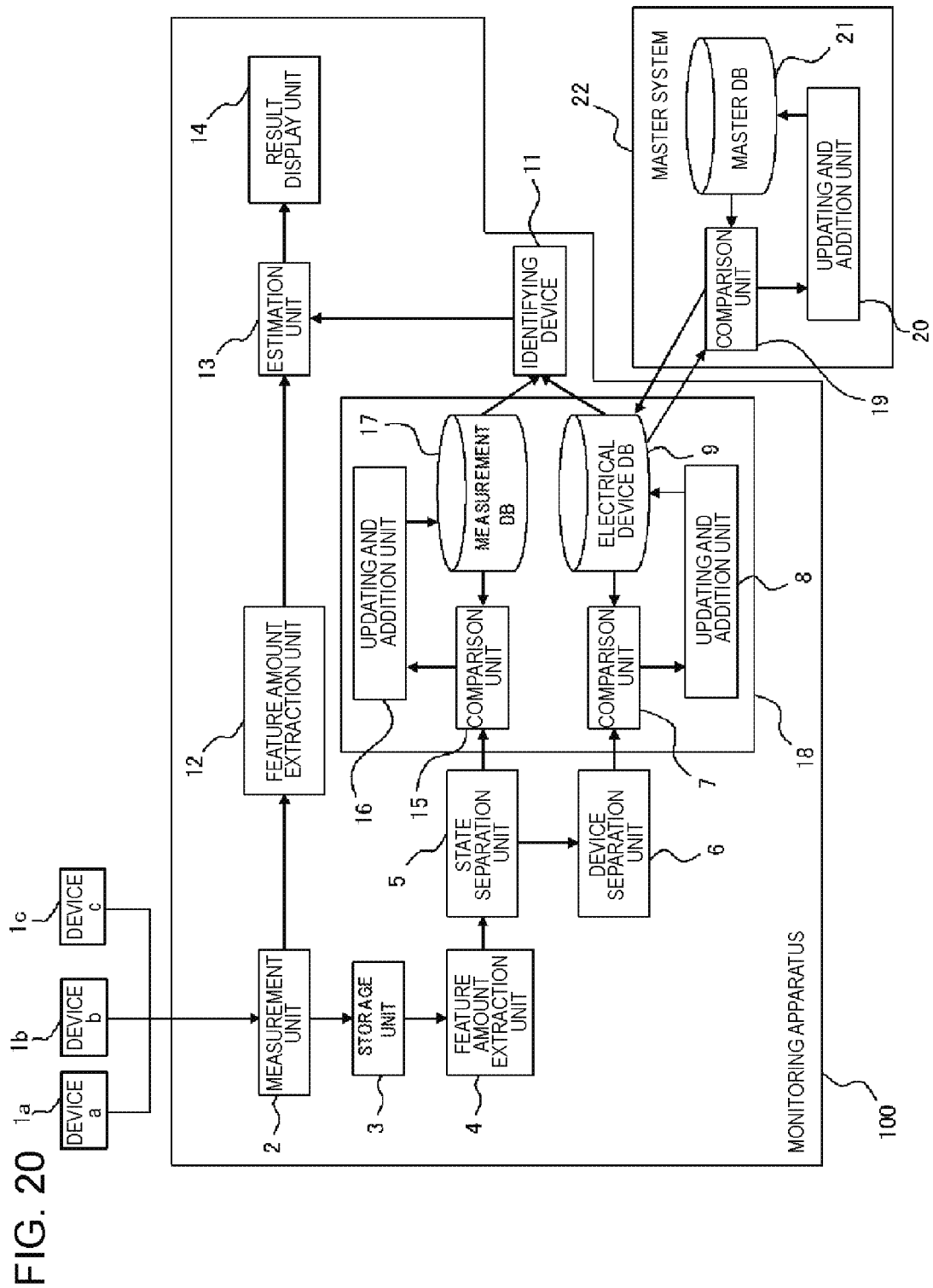
FIG. 20 is an example of a functional block diagram of the monitoring apparatus according to the present exemplary embodiment.

FIG. 20 illustrates an example of a functional block diagram of a monitoring apparatus according to the present exemplary embodiment. As shown in the drawing, a monitoring apparatus 100 according to the present exemplary embodiment is different from the monitoring apparatus 100 (see FIG. 19) according to the ninth exemplary embodiment in that the monitoring apparatus 100 is configured to be able to communicate with a master system 22. Configurations of a measurement unit 2, a storage unit 3, a feature amount extraction unit 4, a state separation unit 5, a device separation unit 6, a comparison unit 7, an updating and addition unit 8, an identifying device 11, a feature amount extraction unit 12, an estimation unit 13, a result display unit 14, a comparison unit 15, an updating and addition unit 16 and a measurement DB 17 are the same as those in the ninth and tenth exemplary embodiments.

The master system 22 includes a comparison unit 19, an updating and addition unit 20, and a master DB 21. The master DB 21 is a database capable of saving a feature amount or a usage state of an electrical device which is obtained by combining pieces of data transmitted from a plurality of users and data in which the electrical device and the feature amount are combined with each other.

The comparison unit 19 compares feature amounts stored in the electrical device DB 9 with feature amounts stored in the master DB 21 to determine whether feature amounts (feature amounts having values that approximate to each other to a predetermined level or higher) of the same electrical device are present. When feature amounts of the same electrical device are present, the updating and addition unit 20 updates the master DB 21. On the other hand, when feature amounts of the same electrical device are not present, the updating and addition unit 20 registers the feature amounts in the master DB 21. The master system 22 is a system that continuously operates the comparison unit 19 and the updating and addition unit 20 whenever the feature amounts stored in the electrical device DB 9 are transmitted from the monitoring apparatus 100.

Further, the monitoring apparatus 100 can communicate with the master system 22, can acquire feature amounts saved in the master DB 21, and can store the acquired feature amounts in the electrical device DB 9.

Regarding the master DB 21, the internal configuration such as saved data does not matter. The master DB 21 may be used in such a manner as to save data for each unit (for example, a household, a building, and the like), or may be used as a backup of data of each unit. In addition, a database in which pieces of data obtained in respective units are combined may be created, or pieces of data restricted to a certain area may be combined. Further, a person in a certain unit may be able to acquire feature amounts obtained in any other unit, or may be able to acquire only feature amounts obtained in a specific unit (unit in which the execution of mutual sharing of information is registered in advance).

Feature amounts registered in the master DB 21 may be in the form of a data table in which feature amounts and electrical devices are statistically associated with each other using results of association, which are registered in the electrical device DB 9 by various users, between feature amounts and electrical devices. For example, the feature amounts may be in the form of a database in which a plurality of electrical devices are associated with one feature amount by statistics of aggregated data like the probability of being an electric heater is 70% and the probability of being a drier is 30% with respect to a certain feature amount. Meanwhile, information regarding the feature amounts and the electrical devices which are associated with each other here may be acquired by a user of each unit (for example, a household, a building, and the like) and may be stored in the electrical device DB 9 within each unit.

According to the present exemplary embodiment, a user of each unit (for example, a household, a building, and the like) can associate a feature amount with an electrical device simply by acquiring a data table which is present in the master DB 21, and thus it is possible to eliminate a user's burden of registering a device by himself or herself.

In addition, the master DB 21 can incorporate feature amounts transmitted from a plurality of units (for example, a household, a building, and the like), and thus may have highly-accurate feature amounts. Therefore, when a feature amount required by a user of each unit (for example, a household, a building, and the like) is present in the master DB 21, the user may acquire the feature amount from the master DB 21. As a result, the user can register a highly-accurate feature amount in the electrical device DB 9.

Eleventh Exemplary Embodiment

In the present exemplary embodiment, a specific example of a monitoring apparatus 100 in a configuration of FIG. 20 will be described.

First, a measurement unit 2 that measures a current and a voltage will be described. The measurement unit 2 measures pieces of current and voltage waveform data for a plurality of periods of a reference waveform having a frequency of 50 Hz or 60 Hz by using a current and voltage sensor installed at a power trunk line portion before branching or after branching of a distribution board having electrical devices 1a to 1c connected thereto after the branching and sets the measured data to be measurement data. Meanwhile, the voltage waveform is directly taken from the distribution board, but may be taken from a normal power supply, such as a plug socket, which is located after the distribution board. The measurement data is measured at a certain frequency (for example, every 5 seconds), and measurement data obtained once or a plurality of times is saved in the storage unit 3.

Time-series measurement data saved in the storage unit 3 is converted into time-series feature amount data by a feature amount extraction unit 4. The feature amount data extracted by the feature amount extraction unit 4 varies depending not only on a type of device but also on the state of a device. Hereinafter, these pieces of feature amount data will be collectively expressed as feature amount data.

Next, a state separation unit 5 will be described. The state separation unit 5 creates a feature amount data set obtained by collecting pieces of feature amount data, extracted by the feature amount extraction unit 4 from measurement data saved in the storage unit 3, over a certain period of time (for example, one hour).

Next, state separation unit 5 dynamically determines a threshold value for detecting a change (switching between an on-state and an off-state of a power supply) in an operating state of an electrical device, depending on the magnitude of noise of feature amount data. Specifically, for example, with a focus on any data (data at a first point in time in FIG. 3), a plurality of pieces of data A from the above-mentioned data up to before a predetermined number (for example, 30) are set to be pieces of pre-state-change data. In addition, data (data at a second point in time) which is positioned one piece of data later than the subject data at the first point in time is set to be post-state-change data. For example, a value obtained by multiplying a variance value of the pieces of pre-state-change data by a predetermined number (for example, 10) is set to be a threshold value.

Thereafter, the state separation unit 5 determines whether a difference in values between an average value of the pieces of pre-state-change data and the post-state-change data is equal to or greater than the determined threshold value. In a case of being equal to or greater than the threshold value, it is determined that a predetermined condition is satisfied, and a boundary between the first point in time and the second point in time is determined to be a point in time when an operating state of an electrical device has changed (switching between an on-state and an off-state of a power supply).

Meanwhile, a method of detecting a change (switching between an on-state and an off-state of a power supply) point of an operating state of an electrical device may be any method other than a method according to a time series. For example, a feature amount data set for a certain period of time (for example, one hour) may be selected to be grouped, by selecting values of feature amounts in ascending starting from the smallest value of a feature amount during the period of time. At this time, a threshold value to be determined may be a threshold value capable of being set using the magnitude of noise or the like, or may be a threshold value capable of being directly set by a designer or a manager.

Figure 21:
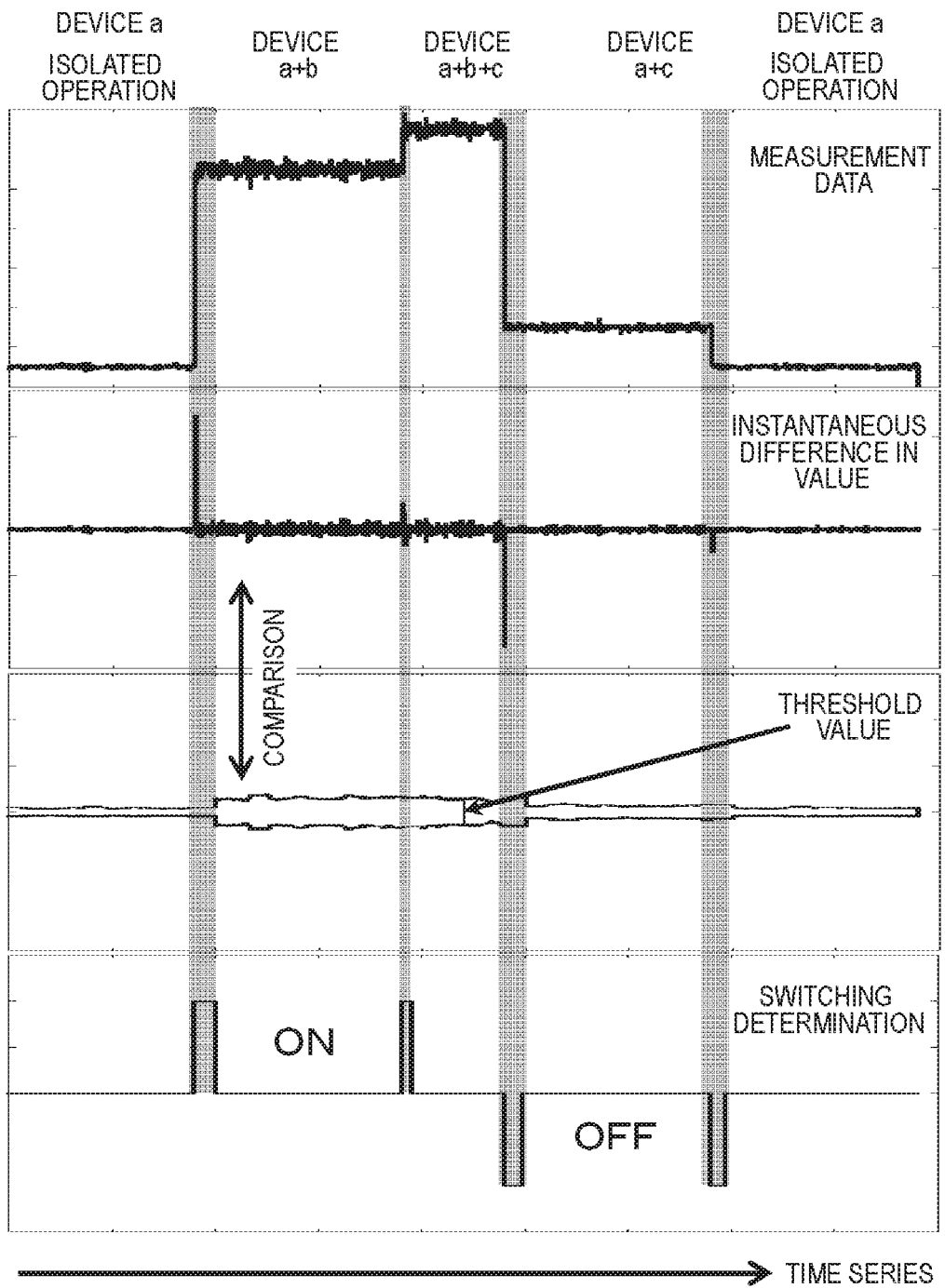
FIG. 21 is a diagram illustrating a data example when a process of detecting a change (switching between an on-state and an off-state of a power supply) point of an operating state of an electrical device using three types of devices of an electrical device a, an electrical device b, and an electrical device c.

FIG. 21 illustrates a data example when the above-described process of detecting a change (switching between an on-state and an off-state of a power supply) point of an operating state of an electrical device is performed using three types of devices of an electrical device a, an electrical device b, and an electrical device c. FIG. 21 is a diagram illustrating changes in measurement data with time (changes in the magnitude of a feature amount with time), an instantaneous difference in values (absolute value of a difference in values between an average value of pre-state-change data and post-state-change data), a threshold value (value obtained by multiplying a variance value of pre-state-change data by a predetermined number, an interval between two lines), and switching determination in this order from the top. When this method is used, it is possible to output a signal for switching determination by inputting only the measurement data.

Next, the state separation unit 5 separates time-series feature amount data created by the feature amount extraction unit 4 into a plurality of groups (common electrical-device-state groups) with a change (switching between an on-state and an off-state of a power supply) point of an operating state of an electrical device as a boundary. When this method is used, it is also possible to perform detection and separation with respect to a switch which is automatically switched by an electrical device regardless of the intention of a human. Thereby, a user is not required to distinguish between a switch which is automatically changed by a device and a switch which is changed by the user's intention.

Figure 22:
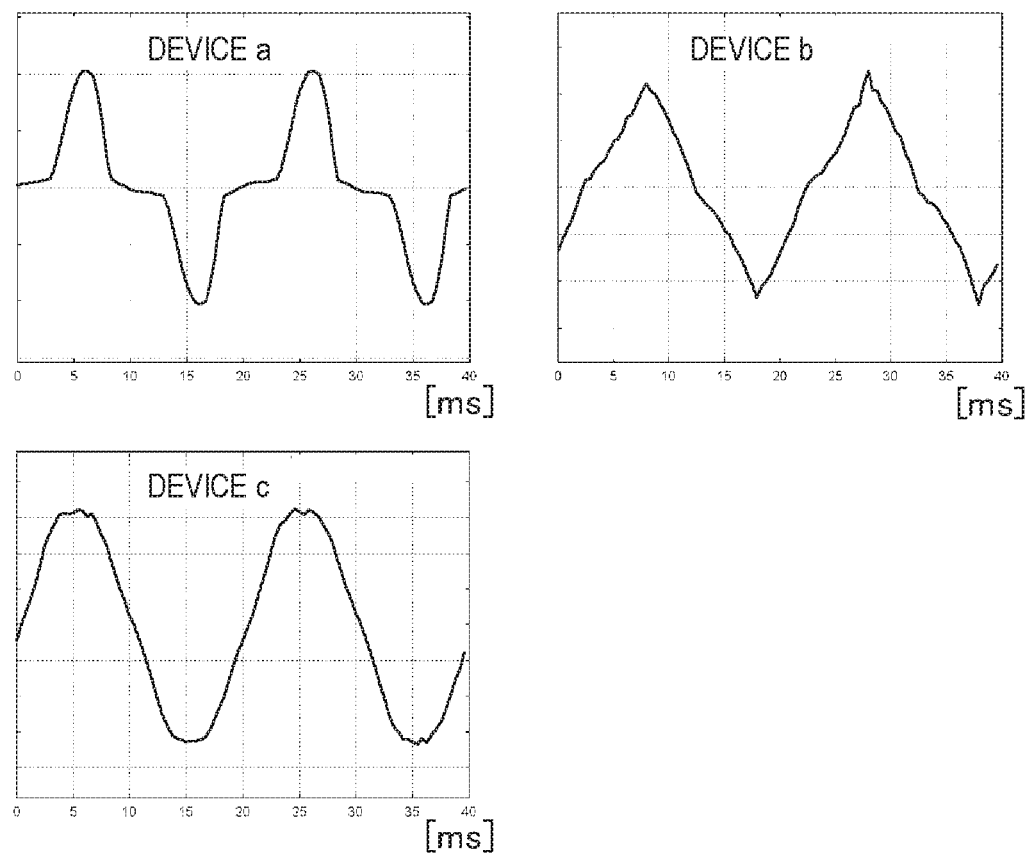
FIG. 22 is a diagram illustrating a feature amount of each single device of the electrical device a, the electrical device b, and the electrical device c.

Next, feature amounts of respective electrical devices are calculated using time-series feature amount data separated into a plurality of groups by the state separation unit 5. Specifically, a statistic of each of the plurality of groups separated by the state separation unit 5 is calculated, and a difference in values between a statistic of a first group and a statistic of a group positioned just before and/or just after the group in the order of time-series is calculated. The calculated difference in values is set to be a feature amount of a certain electrical device. FIG. 22 illustrates data indicating a feature amount of each single device of the electrical device a, the electrical device b, and the electrical device c which are separated by a device separation unit 6.

Next, a comparison unit 7 compares any one feature amount generated by the device separation unit 6 with feature amounts saved in an electrical device DB 99. For example, assuming that an electrical device DB 9 has feature amounts of respective electrical devices and variance information, first it is determined to which electrical device's feature amount in the electrical device DB 9 the feature amount generated by the device separation unit 6 is closest, and it is determined whether the feature amount generated by the device separation unit is within a range of a constant multiple of the variance of the feature amount of the electrical device. When the feature amount is within the range of the variance, the comparison unit 7 determines that the pieces of data are the same data, and an updating and addition unit 8 calculates an average and variance by weighting a frequency and registers the calculated average and variance in the electrical device DB 9 as updated data. In contrast, when the feature amount is not within the range of the variance, the comparison unit 7 determines that the pieces of data are different pieces of data, and the updating and addition unit 8 registers the pieces data in the electrical device DB 9 as feature amounts of a new electrical device which is not yet registered.

Meanwhile, data to be saved may be any type of data such as all pieces of feature amount data obtained by measurement or a data distribution such as a histogram, in addition to the above-mentioned average value and error. There is the possibility of the same change in power consumption, such as the turn-on or turn-off of a specific piece of lighting, occurring on a user side several times within a certain period of time. It is possible to prevent an increase in the amount of data and a wasteful increase in a calculation time by combining pieces of data.

In the above-mentioned database updating and addition system 10, when the combination of pieces of feature amount data (averaging at the time of updating) is performed several times, the number of samples of the feature amount data is increased, and thus it is possible to collect pieces of data having satisfactory statistics with an improved accuracy of an average value and an error in the electrical device DB 9. Meanwhile, a feature-amount-data collecting system proceeds in parallel with the determination of an operating state and power consumption of a device, and thus data is continuously automatically collected while the power supply of a device related to the system of the present invention is turned on. Therefore, a feature amount obtained in the present invention has both a feature that the accuracy thereof is automatically improved and a feature that it is possible to perform recording without missing feature amount data having caused malfunction.

Since it is essential that data is registered in the electrical device DB 9 in order to estimate an operating state of an electrical device, it is not possible to perform an estimation process in an initial state where data is not registered. Consequently, during this time, a comment such as "an operating state of an electrical device cannot be specified due to insufficient collected data" may be output to a user. In addition, an instantaneous value such as a power value or a current value may be output.

After a certain degree of time has passed since installation, a certain number of feature amounts are gathered in the electrical device DB 9. During this time, an estimation process is performed using feature amounts collected up to that time. An estimation result is output when an operating state of an electrical device can be specified, and a comment such as "operating state of electrical device cannot be specified due to insufficient collected data" may be output when an operating state of an electrical device cannot be specified.

After a sufficient time has passed since installation, a sufficient number of feature amounts are gathered in the electrical device DB 9. Then, it is possible to estimate an operating state of an electrical device with a sufficient level of accuracy.

Hereinafter, effects of the present exemplary embodiment will be described.

In the related art, the collection of feature amount data and the estimation of power consumption are performed separately. Accordingly, when a new device is introduced, it is necessary to newly collect feature amounts for the new device, which requires effort. In the present exemplary embodiment, a feature amount is extracted from measurement values measured in each household or the like and is registered in the electrical device DB 9. Accordingly, when a new electrical device is introduced, it is possible to register a feature amount of the new electrical device in the electrical device DB 9 without performing troublesome setting.

Further, a numerical algorithm such as machine learning is used in estimating an operating state and power consumption of an electrical device, and thus there is a problem in that a process becomes slow as the number of pieces of data increases. When the present exemplary embodiment is used, the frequency of use of the electrical device can be recognized, and thus an apparatus having a low frequency of use may be temporarily removed from a feature amount database. In this manner, it is possible to improve the efficiency of the process by reducing the number of pieces of feature amount data.

Hereinafter, an example of a reference configuration will be appended.

1. A monitoring apparatus including:
    an acquisition unit that acquires first time-series data which is time-series measurement data regarding an electrical device or time-series data of a feature amount calculated on the basis of the measurement data; and
    a registration and updating unit that executes at least one of the following processes,
    when a difference in values between a pre-state-change data value which is a value of data at a first point in time in the first time-series data or a statistic of values of a plurality of pieces of data from data at a point in time, in the first time-series data, which is earlier than the first point in time by a predetermined period of time to the data at the first point in time and a post-state-change data value which is a value of data at a second point in time, in the first time-series data, which is positioned temporally one piece of data later than the data at the first point in time or a statistic of values of a plurality of pieces of data from the data at the second point in time to data at a point in time, in the first time-series data, which is later than the data at the second point in time by a predetermined period of time satisfies a predetermined condition,
    a first process of registering a pre-state-change representative value, which is a value calculated using the pre-state-change data value, in a state feature amount storage unit included in a feature amount storage unit as a feature amount in a first state,
    a second process of registering a post-state-change representative value, which is a value calculated using the post-state-change data value, in the state feature amount storage unit as a feature amount in a second state different from the first state,
    a third process of registering a difference in values between the pre-state-change representative value and the post-state-change representative value in a feature-amount-per-device storage unit included in the feature amount storage unit as a feature amount of a first electrical device, and
    a fourth process of updating the feature amount storage unit using at least one of the pre-state-change representative value, the post-state-change representative value, and the difference in values between the pre-state-change representative value and the post-state-change representative value.

2. The monitoring apparatus according to 1, further including:
- a determination unit that determines whether the difference in values between the pre-state-change representative value and the post-state-change representative value satisfies the predetermined condition, and transmits at least one of the pre-state-change representative value, the post-state-change representative value, and the difference in values between the pre-state-change representative value and the post-state-change representative value to the registration and updating unit when the difference in values satisfies the predetermined condition.

3. The monitoring apparatus according to 2,
- wherein when the difference in values between the pre-state-change data value and the post-state-change data value is equal to or greater than a predetermined threshold value, the determination unit determines that the predetermined condition is satisfied.

4. The monitoring apparatus according to 3,
- wherein the determination unit calculates the predetermined threshold value using values of a plurality of pieces of data from data at a point in time, in the first time-series data, which is earlier than the first point in time by a predetermined period of time to the data at the first point in time or values of a plurality of pieces of data from the data at the second point in time to data at a point in time, in the first time-series data, which is later than the data at the second point in time by a predetermined period of time.

5. The monitoring apparatus according to any one of 1 to 4,
- wherein when the difference in values between the pre-state-change data value and the post-state-change data value satisfies the predetermined condition, the registration and updating unit confirms whether a feature amount approximating to the pre-state-change representative value to a predetermined level or higher is stored in the state feature amount storage unit, and
- wherein the registration and updating unit executes the first process when the feature amount is not stored, and executes the fourth process when the feature amount is stored.

6. The monitoring apparatus according to any one of 1 to 5,
- wherein when the difference in values between the pre-state-change data value and the post-state-change data value satisfies the predetermined condition, the registration and updating unit confirms whether a feature amount approximating to the post-state-change representative value to a predetermined level or higher is stored in the state feature amount storage unit, and
- wherein the registration and updating unit executes the second process when the feature amount is not stored, and executes the fourth process when the feature amount is stored.

7. The monitoring apparatus according to any one of 1 to 6,
- wherein when the difference in values between the pre-state-change data value and the post-state-change data value satisfies the predetermined condition, the registration and updating unit confirms whether a feature amount approximating to the difference in values between the pre-state-change representative value and the post-state-change representative value to a predetermined level or higher is stored in the feature-amount-per-device storage unit, and
- wherein the registration and updating unit executes the third process when the feature amount is not stored, and executes the fourth process when the feature amount is stored.

8. The monitoring apparatus according to any one of 1 to 7, further including:
- an input reception unit that receives a user input of at least one of information for identifying an electrical device operating during the first state, information for identifying an electrical device operating during the second state, and information for identifying an electrical device having a power supply switched between an on-state and an off-state during a change from the first state to the second state,
- wherein the registration and updating unit executes at least one of a process of associating the information for identifying an electrical device operating during the first state with the feature amount in the first state which is stored in the feature amount storage unit, a process of associating the information for identifying an electrical device operating during the second state with the feature amount in the second state which is stored in the feature amount storage unit, and a process of associating the information for identifying an electrical device having a power supply switched between an on-state and an off-state during a change from the first state to the second state with the feature amount of the first electrical device which is stored in the feature amount storage unit.

9. The monitoring apparatus according to any one of 1 to 8, further including:
- an estimation unit that estimates operating states of a plurality of electrical devices using the feature amount stored in the feature amount storage unit and the measurement data acquired by the acquisition unit.

10. A monitoring method for causing a computer to execute:
- an acquisition step of acquiring first time-series data which is time-series measurement data regarding an electrical device or time-series data of a feature amount calculated on the basis of the measurement data; and
- a registration and updating step of executing at least one of the following processes,
- when a difference in values between a pre-state-change data value which is a value of data at a first point in time in the first time-series data or a statistic of values of a plurality of pieces of data from data at a point in time, in the first time-series data, which is earlier than the first point in time by a predetermined period of time to the data at the first point in time and a post-state-change data value which is a value of data at a second point in time, in the first time-series data, which is positioned temporally one piece of data later than the data at the first point in time or a statistic of values of a plurality of pieces of data from the data at the second point in time to data at a point in time, in the first time-series data, which is later than the data at the second point in time by a predetermined period of time satisfies a predetermined condition,
- a first process of registering a pre-state-change representative value, which is a value calculated using the pre-state-change data value, in a state feature amount storage unit included in a feature amount storage unit as a feature amount in a first state,
- a second process of registering a post-state-change representative value, which is a value calculated using the post-state-change data value, in the state feature amount storage unit as a feature amount in a second state different from the first state,
a third process of registering a difference in values between the pre-state-change representative value and the post-state-change representative value in a feature-amount-per-device storage unit included in the feature amount storage unit as a feature amount of a first electrical device, and
a fourth process of updating the feature amount storage unit using at least one of the pre-state-change representative value, the post-state-change representative value, and the difference in values between the pre-state-change representative value and the post-state-change representative value.

10-2. The monitoring method according to 10, further executing:
a determination step of determining whether the difference in values between the pre-state-change representative value and the post-state-change representative value satisfies the predetermined condition, and transmitting at least one of the pre-state-change representative value, the post-state-change representative value, and the difference in values between the pre-state-change representative value and the post-state-change representative value to the registration and updating step when the difference in values satisfies the predetermined condition.

10-3. The monitoring method according to 10-2,
wherein in the determination step, when the difference in values between the pre-state-change data value and the post-state-change data value is equal to or greater than a predetermined threshold value, it is determined that the predetermined condition is satisfied.

10-4. The monitoring method according to 10-3,
wherein in the determination step, the predetermined threshold value is calculated using values of a plurality of pieces of data from data at a point in time, in the first time-series data, which is earlier than the first point in time by a predetermined period of time to the data at the first point in time or values of a plurality of pieces of data from the data at the second point in time to data at a point in time, in the first time-series data, which is later than the data at the second point in time by a predetermined period of time.

10-5. The monitoring method according to any one of 10 to 10-4,
wherein in the registration and updating step, when the difference in values between the pre-state-change data value and the post-state-change data value satisfies the predetermined condition, it is confirmed whether a feature amount approximating to the pre-state-change representative value to a predetermined level or higher is stored in the state feature amount storage unit, and
wherein the first process is executed when the feature amount is not stored, and the fourth process is executed when the feature amount is stored.

10-6. The monitoring method according to any one of 10 to 10-5,
wherein in the registration and updating step, when the difference in values between the pre-state-change data value and the post-state-change data value satisfies the predetermined condition, it is confirmed whether a feature amount approximating to the post-state-change representative value to a predetermined level or higher is stored in the state feature amount storage unit, and wherein the second process is executed when the feature amount is not stored, and the fourth process is executed when the feature amount is stored.

10-7. The monitoring method according to any one of 10 to 10-6,
wherein in the registration and updating step, when the difference in values between the pre-state-change data value and the post-state-change data value satisfies the predetermined condition, it is confirmed whether a feature amount approximating to the difference in values between the pre-state-change representative value and the post-state-change representative value to a predetermined level or higher is stored in the feature-amount-per-device storage unit, and
wherein the third process is executed when the feature amount is not stored, and the fourth process is executed when the feature amount is stored.

10-8. The monitoring method according to any one of 10 to 10-7, further executing:
an input reception step of receiving a user input of at least one of information for identifying an electrical device operating during the first state, information for identifying an electrical device operating during the second state, and information for identifying an electrical device having a power supply switched between an on-state and an off-state during a change from the first state to the second state,
wherein in the registration and updating step, at least one of the following processes is executed, the processes including a process of associating the information for identifying an electrical device operating during the first state with the feature amount in the first state which is stored in the feature amount storage unit, a process of associating the information for identifying an electrical device operating during the second state with the feature amount in the second state which is stored in the feature amount storage unit, and a process of associating the information for identifying an electrical device having a power supply switched between an on-state and an off-state during a change from the first state to the second state with the feature amount of the first electrical device which is stored in the feature amount storage unit.

10-9. The monitoring method according to any one of 10 to 10-8, further executing:
an estimation step of estimating operating states of a plurality of electrical devices using the feature amount stored in the feature amount storage unit and the measurement data acquired in the acquisition step.

11. A program causing a computer to function as:
an acquisition unit that acquires first time-series data which is time-series measurement data regarding an electrical device or time-series data of a feature amount calculated on the basis of the measurement data; and
a registration and updating unit that executes at least one of the following processes,
when a difference in values between a pre-state-change data value which is a value of data at a first point in time in the first time-series data or a statistic of values of a plurality of pieces of data from data at a point in time, in the first time-series data, which is earlier than the first point in time by a predetermined period of time to the data at the first point in time and a post-state-change data value which is a value of data at a second point in time, in the first time-series data, which is positioned temporally one piece of data later than the data at the first point in time or a statistic of values of a plurality of pieces of data from the data at the second point in time to data at a point in time, in the first time-series data, which is later than the data at the second point in time by a predetermined period of time satisfies a predetermined condition, a first process of registering a pre-state-change representative value, which is a value calculated using the pre-state-change data value, in a state feature amount storage unit included in a feature amount storage unit as a feature amount in a first state, a second process of registering a post-state-change representative value, which is a value calculated using the post-state-change data value, in the state feature amount storage unit as a feature amount in a second state different from the first state, a third process of registering a difference in values between the pre-state-change representative value and the post-state-change representative value in a feature-amount-per-device storage unit included in the feature amount storage unit as a feature amount of a first electrical device, and a fourth process of updating the feature amount storage unit using at least one of the pre-state-change representative value, the post-state-change representative value, and the difference in values between the pre-state-change representative value and the post-state-change representative value.

11-2. The program according to 11, causing the computer to further function as:

a determination unit that determines whether the difference in values between the pre-state-change representative value and the post-state-change representative value satisfies the predetermined condition, and transmits at least one of the pre-state-change representative value, the post-state-change representative value, and the difference in values between the pre-state-change representative value and the post-state-change representative value to the registration and updating unit when the difference in values satisfies the predetermined condition.

11-3. The program according to 11-2, wherein when the difference in values between the pre-state-change data value and the post-state-change data value is equal to or greater than a predetermined threshold value, the determination unit is made to determine that the predetermined condition is satisfied.

11-4. The program according to 11-3, wherein the determination unit is made to calculate the predetermined threshold value using values of a plurality of pieces of data from data at a point in time, in the first time-series data, which is earlier than the first point in time by a predetermined period of time to the data at the first point in time or values of a plurality of pieces of data from the data at the second point in time to data at a point in time, in the first time-series data, which is later than the data at the second point in time by a predetermined period of time.

11-5. The program according to any one of 11 to 11-4, wherein when the difference in values between the pre-state-change data value and the post-state-change data value satisfies the predetermined condition, the registration and updating unit is made to confirm whether a feature amount approximating to the pre-state-change representative value to a predetermined level or higher is stored in the state feature amount storage unit, and wherein the registration and updating unit is made to execute the first process when the feature amount is not stored, and is made to execute the fourth process when the feature amount is stored.

11-6. The program according to any one of 11 to 11-5, wherein when the difference in values between the pre-state-change data value and the post-state-change data value satisfies the predetermined condition, the registration and updating unit is made to confirm whether a feature amount approximating to the post-state-change representative value to a predetermined level or higher is stored in the state feature amount storage unit, and wherein the registration and updating unit is made to execute the second process when the feature amount is not stored, and is made to execute the fourth process when the feature amount is stored.

11-7. The program according to any one of 11 to 11-6, wherein when the difference in values between the pre-state-change data value and the post-state-change data value satisfies the predetermined condition, the registration and updating unit is made to confirm whether a feature amount approximating to the difference in values between the pre-state-change representative value and the post-state-change representative value to a predetermined level or higher is stored in the feature-amount-per-device storage unit, and wherein the registration and updating unit is made to execute the third process when the feature amount is not stored, and is made to execute the fourth process when the feature amount is stored.

11-8. The program according to any one of 11 to 11-7, causing the computer to further function as:

an input reception unit that receives a user input of at least one of information for identifying an electrical device operating during the first state, information for identifying an electrical device operating during the second state, and information for identifying an electrical device having a power supply switched between an on-state and an off-state during a change from the first state to the second state, wherein the registration and updating unit is made to execute at least one of a process of associating the information for identifying an electrical device operating during the first state with the feature amount in the first state which is stored in the feature amount storage unit, a process of associating the information for identifying an electrical device operating during the second state with the feature amount in the second state which is stored in the feature amount storage unit, and a process of associating the information for identifying an electrical device having a power supply switched between an on-state and an off-state during a change from the first state to the second state with the feature amount of the first electrical device which is stored in the feature amount storage unit.

11-9. The program according to any one of 11 to 11-8, causing the computer to further function as:

an estimation unit that estimates operating states of a plurality of electrical devices using the feature amount stored in the feature amount storage unit and the measurement data acquired by the acquisition unit.

This application claims priority from Japanese Patent Application No. 2013-148325 filed on Jul. 17, 2013, the content of which is incorporated herein by reference in its entirety.

The invention claimed is:

1. A monitoring apparatus comprising:
a memory storing instructions; and
a processor configured to execute the instructions to:
acquire, using one or more power measurement sensors, data values corresponding to a plurality of time points, the data values being associated with power consumption of an electrical device group;
determine, a first statistic of data values corresponding to time points within a first period prior to a first time point, and a second statistic of data values corresponding to time points within a second period after a second time point,
wherein each of the first statistic and the second statistic is one of an average value, a median, or a most frequent value of the corresponding data values;
determine a difference between the first statistic and the second statistic;
determine whether the difference satisfies a predetermined condition;
extract, when the difference satisfies the predetermined condition, a first power consumption feature amount corresponding to the first statistic and a second power consumption feature amount corresponding to the second statistic, the first and second power consumption feature amounts being extracted from corresponding waveform data associated with at least one of power consumption, current consumption, and an input voltage; and
register, as reference data, the extracted first power consumption feature amount and the extracted second power consumption feature amount in a feature amount storage database;
wherein the reference data is used to estimate an operating state of an electrical device by comparing the reference data and measurement data acquired by the power measurement sensors.

2. The monitoring apparatus according to claim 1, wherein the processor is further configured to execute the instructions to:
determine a difference between the first power consumption feature amount and the second power consumption feature amount, as a power consumption feature amount of a first electrical device,
determine the first power consumption feature amount as a power consumption feature amount of a first electrical device group, or
determine the second power consumption feature amount as a power consumption feature amount of a second electrical device group.

3. The monitoring apparatus according to claim 1, wherein the predetermined condition is whether the difference is equal to or greater than a predetermined threshold value.

4. The monitoring apparatus according to claim 1, wherein the processor is further configured to execute the instructions to:
compare the first power consumption feature amount and the second power consumption feature amount to a plurality of stored power consumption feature amounts; and
if a power consumption feature amount approximating to one of the first power consumption feature amount and the second power consumption feature amount is stored, update the stored power consumption feature amount to an average of the one of the first power consumption feature amount and the second power consumption feature amount and the stored power consumption feature amount.

5. The monitoring apparatus according to claim 4, wherein the processor is further configured to execute the instructions to:
if no power consumption feature amount approximating to one of the first power consumption feature amount and the second power consumption feature amount is stored, store the first power consumption feature amount and the second power consumption feature amount.

6. The monitoring apparatus according to claim 1, wherein the processor is further configured to execute the instructions to:
receive user input indicating at least one of: information for identifying a first electrical device operating at the first time point, a second electrical device operating at the second time point, and a third electrical device, an operating state of the third electrical device being changed between the first time point and the second time point; and
associate the first electrical device with a stored power consumption feature amount corresponding to the first time point,
associate the second electrical device with a stored power consumption feature amount corresponding to the second time point, or
associate the third electrical device with a stored power consumption feature amount corresponding to the third electrical device.

7. A computer-implemented monitoring method, comprising:
acquiring, using one or more power measurement sensors, data values corresponding to a plurality of time points, the data values being associated with power consumption of an electrical device group;
determining, a first statistic of data values corresponding to time points within a first period prior to a first time point, and a second statistic of data values corresponding to time points within a second period after a second time point,
wherein each of the first statistic and the second statistic is one of an average value, a median, or a most frequent value of the corresponding data values;
determining a difference between the first statistic and the second statistic;
determining whether the difference satisfies a predetermined condition;
extracting, when the difference satisfies the predetermined condition, a first power consumption feature amount corresponding to the first statistic and a second power consumption feature amount corresponding to the second statistic, the first and second power consumption feature amounts being extracted from corresponding waveform data associated with at least one of power consumption, current consumption, and an input voltage; and
registering, as reference data, the extracted first power consumption feature amount and the extracted second power consumption feature amount in a feature amount storage database;
wherein the reference data is used to estimate an operating state of an electrical device by comparing the reference data and measurement data acquired by the power measurement sensors.

8. The method according to claim 7, further comprising:
determining a difference between the first power consumption feature amount and the second power consumption feature amount, as a power consumption feature amount of a first electrical device,
determining the first power consumption feature amount as a power consumption feature amount of a first electrical device group, or
determining the second power consumption feature amount as a power consumption feature amount of a second electrical device group.

9. The method according to claim 7, wherein:
the predetermined condition is whether the difference is equal to or greater than a predetermined threshold value.

10. The method according to claim 7, further comprising:
comparing the first power consumption feature amount and the second power consumption feature amount to a plurality of stored power consumption feature amounts; and
if a power consumption feature amount approximating to one of the first power consumption feature amount and the second power consumption feature amount is stored, updating the stored power consumption feature amount to an average of the one of the first power consumption feature amount and the second power consumption feature amount and the stored power consumption feature amount.

11. The method according to claim 10, further comprising:
if no power consumption feature amount approximating to one of the first power consumption feature amount and the second power consumption feature amount is stored, storing the first power consumption feature amount and the second power consumption feature amount.

12. The method according to claim 7, further comprising:
receiving user input indicating at least one of: information for identifying a first electrical device operating at the first time point, a second electrical device operating at the second time point, and a third electrical device, an operating state of the third electrical device being changed between the first time point and the second time point; and
associating the first electrical device with a stored power consumption feature amount corresponding to the first time point,
associating the second electrical device with a stored power consumption feature amount corresponding to the second time point, or
associating the third electrical device with a stored power consumption feature amount corresponding to the third electrical device.

13. A non-transitory storage medium storing a program causing a computer to perform a monitoring method comprising:
acquiring, using one or more power measurement sensors, data values corresponding to a plurality of time points, the data values being associated with power consumption of an electrical device group;
determining, a first statistic of data values corresponding to time points within a first period prior to a first time point, and a second statistic of data values corresponding to time points within a second period after a second time point,
wherein each of the first statistic and the second statistic is one of an average value, a median, or a most frequent value of the corresponding data values;
determining a difference between the first statistic and the second statistic;
determining whether the difference satisfies a predetermined condition;
extracting, when the difference satisfies the predetermined condition, a first power consumption feature amount corresponding to the first statistic and a second power consumption feature amount corresponding to the second statistic, the first and second power consumption feature amounts being extracted from corresponding waveform data associated with at least one of power consumption, current consumption, and an input voltage; and
registering, as reference data, the extracted first power consumption feature amount and the extracted second power consumption feature amount in a feature amount storage database;
wherein the reference data is used to estimate an operating state of an electrical device by comparing the reference data and measurement data acquired by the power measurement sensors.

* * * * *